(12) United States Patent
Hoshi et al.

(10) Patent No.: US 12,356,747 B2
(45) Date of Patent: Jul. 8, 2025

(54) IMAGE CAPTURING ELEMENT, MANUFACTURING METHOD, AND ELECTRONIC DEVICE

(71) Applicant: Sony Semiconductor Solutions Corporation, Kanagawa (JP)

(72) Inventors: Hironori Hoshi, Kanagawa (JP); Atsushi Okuyama, Kanagawa (JP); Itaru Oshiyama, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 1073 days.

(21) Appl. No.: 17/291,184

(22) PCT Filed: Oct. 23, 2019

(86) PCT No.: PCT/JP2019/041454
§ 371 (c)(1),
(2) Date: Feb. 1, 2022

(87) PCT Pub. No.: WO2020/095674
PCT Pub. Date: May 14, 2020

(65) Prior Publication Data
US 2022/0223642 A1    Jul. 14, 2022

(30) Foreign Application Priority Data
Nov. 5, 2018    (JP) ................. 2018-207880

(51) Int. Cl.
*H10F 39/12* (2025.01)
*H10F 39/00* (2025.01)
*H10F 39/18* (2025.01)

(52) U.S. Cl.
CPC ....... *H10F 39/8057* (2025.01); *H10F 39/024* (2025.01); *H10F 39/182* (2025.01); *H10F 39/199* (2025.01); *H10F 39/8063* (2025.01)

(58) Field of Classification Search
CPC .. H10F 39/8057; H10F 39/199; H10F 39/014; H10F 39/807; H10F 39/8027
See application file for complete search history.

(56) References Cited

U.S. PATENT DOCUMENTS

| | | | |
|---|---|---|---|
| 2012/0138568 A1 | 6/2012 | Na | |
| 2012/0248560 A1* | 10/2012 | Lee | H10F 39/807<br>257/E31.127 |

(Continued)

FOREIGN PATENT DOCUMENTS

| | | |
|---|---|---|
| CN | 101556964 A | 10/2009 |
| CN | 102214657 A | 10/2011 |

(Continued)

OTHER PUBLICATIONS

International Search Report mailed Jan. 7, 2020 in connection with PCT/JP2019/041454.

*Primary Examiner* — Phat X Cao
(74) *Attorney, Agent, or Firm* — K&L Gates LLP

(57) ABSTRACT

The present disclosure relates to an image capturing element, a manufacturing method, and an electronic device that make it possible to improve effects of reducing crosstalk. A trench part provided from a light-receiving surface side of a semiconductor substrate in which photoelectric conversion parts that photoelectrically convert emitted light are formed and between the plurality of photoelectric conversion parts; and a protrusion part provided with at least an inclined surface that is inclined with respect to a side surface of the trench part to widen a space of the trench part in one part of the trench part are provided. The present technology can be applied, for example, to backlit solid-state image capturing elements.

9 Claims, 27 Drawing Sheets

(56) References Cited

U.S. PATENT DOCUMENTS

| | | | | |
|---|---|---|---|---|
| 2013/0105928 | A1* | 5/2013 | Costello | H10F 39/807 257/E31.119 |
| 2015/0008555 | A1* | 1/2015 | Mizuta | H10F 77/241 257/432 |
| 2015/0311248 | A1 | 10/2015 | Lee | |
| 2016/0204143 | A1 | 7/2016 | Lee | |
| 2017/0062512 | A1 | 3/2017 | Chou | |
| 2017/0170231 | A1* | 6/2017 | Cheng | H10F 39/014 |
| 2017/0278893 | A1 | 9/2017 | Cheng | |
| 2020/0027913 | A1 | 1/2020 | Nomura | |

FOREIGN PATENT DOCUMENTS

| | | |
|---|---|---|
| CN | 103545325 A | 1/2014 |
| CN | 104282704 A | 1/2015 |
| CN | 104347660 A | 2/2015 |
| CN | 105529342 A | 4/2016 |
| CN | 107408568 A | 11/2017 |
| JP | S62149153 A | 7/1987 |
| JP | H02303048 A | 12/1990 |
| JP | H03241761 A | 10/1991 |
| JP | H04256336 A | 9/1992 |
| JP | 2006156926 A | 6/2006 |
| JP | 2007200980 A | 8/2007 |
| JP | 2013030803 A | 2/2013 |
| JP | 2013065688 A | 4/2013 |
| JP | 2013098446 A | 5/2013 |
| JP | 2014017615 A | 1/2014 |
| JP | 2015029047 A | 2/2015 |
| JP | 2015035555 A | 2/2015 |
| KR | 20170026053 A | 3/2017 |
| TW | 201507124 A | 2/2015 |
| WO | 2017130723 A | 8/2017 |
| WO | WO-2018150902 A1 | 8/2018 |

\* cited by examiner

IMAGE CAPTURING ELEMENT, MANUFACTURING METHOD, AND ELECTRONIC DEVICE

TECHNICAL FIELD

The present disclosure relates to an image capturing element, a manufacturing method, and an electronic device, and in particular relates to an image capturing element, a manufacturing method, and an electronic device that make it possible to improve effects of reducing crosstalk.

BACKGROUND ART

Conventionally, in solid-state image capturing devices, in particular, in backlit solid-state image capturing devices, it is known that crosstalk occurs from adjacent pixels. In particular, in a solid-state image capturing device having a global shutter function, crosstalk to a charge storage unit causes an increase in a stored charge, leading to degradation in the global shutter function.

Therefore, to avoid degradation in resolution and color reproducibility resulting from the occurrence of crosstalk, luminance difference, and the like, technology to provide an element separating part so as to separate adjacent pixels is used.

For example, Patent Document 1 proposes a structure that implements optical pixel separation by forming a trench from a photodiode side of a back surface to provide a trench that penetrates from the front surface to the back surface of a semiconductor substrate, or by providing a trench that does not penetrate some part.

Furthermore, Patent Document 2 proposes a structure in which a semiconductor substrate and a horizontal light-shielding part are provided at the tip of a trench.

CITATION LIST

Patent Document

Patent Document 1: Japanese Patent Application Laid-Open No. 2013-30803
Patent Document 2: Japanese Patent Application Laid-Open No. 2013-98446

SUMMARY OF THE INVENTION

Problems to be Solved by the Invention

However, in the structure disclosed in Patent Document 1 described above, crosstalk occurs when light leaks to an adjacent pixel resulting from diffraction of light at an end of the trench, and effects of inhibiting the crosstalk is insufficient. Furthermore, in the structure disclosed in Patent Document 2 described above, if volume of the light-shielding part becomes too large, not only an area of the photodiode becomes small and sensitivity decreases, but also crystal defects occur as the light-shielding area increases.

The present disclosure has been made in view of such a situation, and makes it possible to improve the effect of reducing the crosstalk.

Solutions to Problems

An image capturing element according to one aspect of the present disclosure includes: a semiconductor substrate in which photoelectric conversion parts that photoelectrically convert emitted light are formed; a trench part provided from a light-receiving surface side of the semiconductor substrate and between a plurality of the photoelectric conversion parts; and a protrusion part provided with at least an inclined surface that is inclined with respect to a side surface of the trench part to widen a space of the trench part in one part of the trench part. Here, the inclined surface is formed, for example, by performing crystalline anisotropic etching using an etching solution on an Si substrate with a thickness direction defined as a first direction and having a first crystal plane represented with a plane index {111} expanding along a horizontal plane orthogonal to the first direction. For example, in a case where etching using an alkaline solution is performed, etching progresses starting from reaction between the Si dangling bond and OH ion. Therefore, as the number of dangling bonds exposed on the surface increases, etching easily progresses, and as the number of back bonds extending to the bulk side increases, etching does not easily progress. That is, the inclined surface has less than three Si back bonds in a substantially horizontal direction with the substrate surface. Meanwhile, the inclined surface has three Si back bonds in a direction substantially perpendicular to the surface of the Si substrate. For example, if described in the schematic explanatory diagram of FIG. 26, when the Si dangling bond side is in the positive direction with respect to the normal line to the Si {111} plane, the Si back bond means a bond extending in the negative direction on the opposite side. The example of FIG. 26 shows three back bonds at an angle of −19.47° to 19.47° with respect to the {111} plane. Specifically, in a case where a photoelectric conversion part, an inclined surface, and a charge holding part are provided in the Si {111} substrate, the inclined surface includes a surface along a second crystal plane of the Si {111} substrate that is inclined with respect to a first direction that is a thickness direction of the Si substrate and is represented with a plane index {111}.

A manufacturing method according to one aspect of the present disclosure includes; digging a trench part provided from a light-receiving surface side of a semiconductor substrate in which photoelectric conversion parts that photoelectrically convert emitted light are formed and between a plurality of the photoelectric conversion parts; and forming a protrusion part including at least an inclined surface inclined with respect to a side surface of the trench part to widen a space of the trench part in one part of the trench part.

An electronic device according to one aspect of the present disclosure includes an image capturing element including: a semiconductor substrate in which photoelectric conversion parts that photoelectrically convert emitted light are formed; a trench part provided from a light-receiving surface side of the semiconductor substrate and between a plurality of the photoelectric conversion parts; and a protrusion part including at least an inclined surface that is inclined with respect to a side surface of the trench part to widen a space of the trench part in one part of the trench part.

According to one aspect of the present disclosure, a trench part provided from a light-receiving surface side of a semiconductor substrate in which photoelectric conversion parts that photoelectrically convert emitted light are formed and between a plurality of the photoelectric conversion parts is dug; and a protrusion part including at least an inclined surface inclined with respect to a side surface of the trench part to widen a space of the trench part in one part of the trench part is formed.

MODE FOR CARRYING OUT THE INVENTION

A specific embodiment to which the present technology is applied will be described in detail below with reference to the drawings.

<Basic Configuration Example of Element Separating Part Including Protrusion Part>

Figure 1:
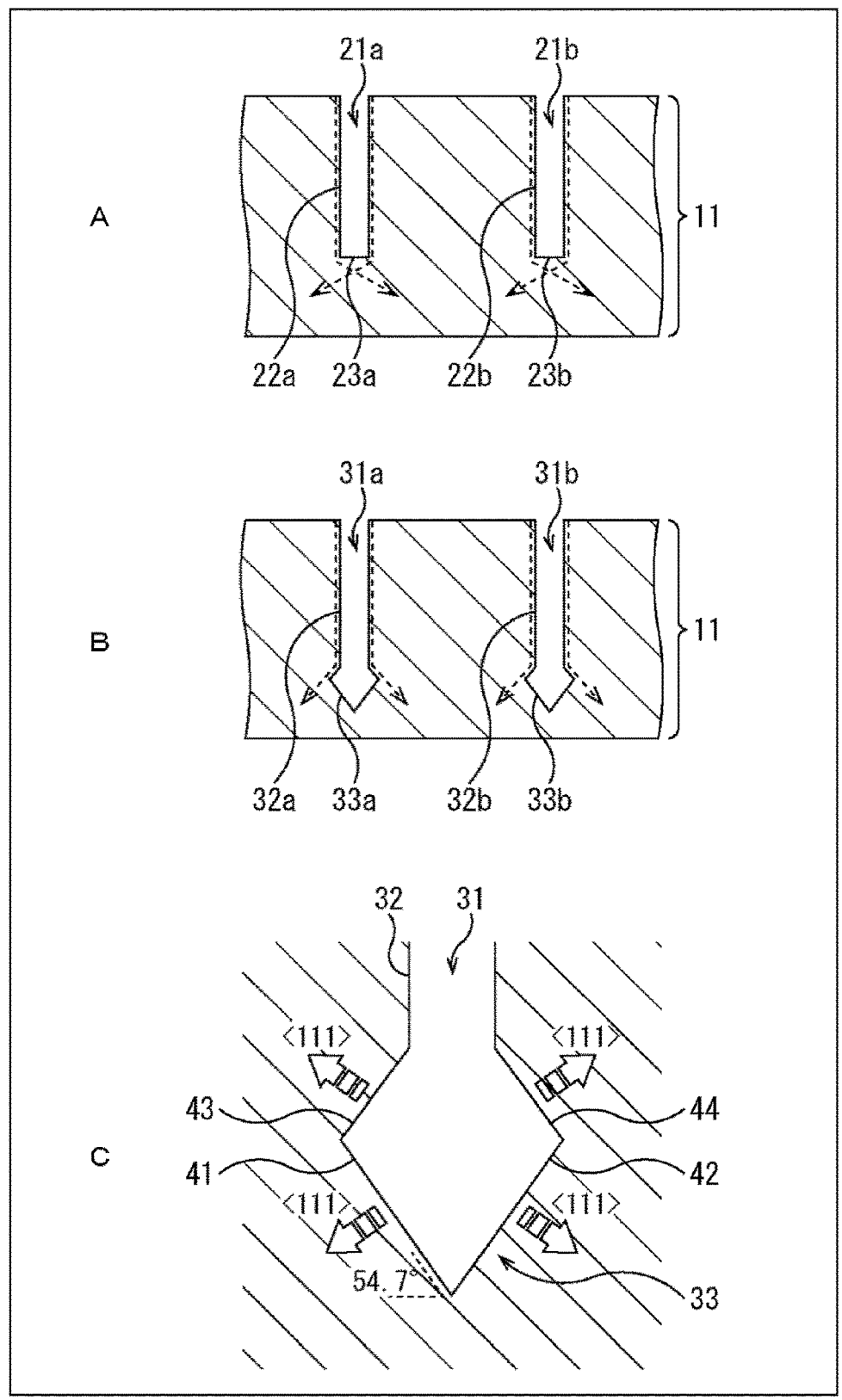
FIG. 1 is a diagram describing a basic configuration example of an element separating part included in an image capturing element to which the present technology is applied.

With reference to FIG. 1, a basic configuration example of an element separating part included in an image capturing element to which the present technology is applied will be described.

A of FIG. 1 shows one example of a cross-sectional configuration of a general element separating part. B of FIG. 1 shows one example of a cross-sectional configuration of the element separating part having a protrusion shape, and C of FIG. 1 shows the enlarged protrusion shape.

For example, as shown in A of FIG. 1, in general, an element separating part 21 is formed by a trench obtained by vertically digging a back surface (or front surface) of a semiconductor substrate 11. Furthermore, as shown in the figure, two element separating parts 21a and 21b separate a pixel provided therebetween from other adjacent pixels. Then, in the element separating part 21, a trench side surface 22 that is substantially perpendicular to the back surface of the semiconductor substrate 11 is formed, and on a bottom surface of the element separating part 21, a flat part 23 including a flat surface substantially perpendicular to the trench side surface 22 is formed.

In contrast, as shown in B of FIG. 1, at a tip portion of an element separating part 31 to which the present technology is applied, a substantially rhombic protrusion part 33 when viewed cross-sectionally is formed to widen a space of a trench side surface 32 obtained by vertically digging the back surface (or front surface) of the semiconductor substrate 11. Furthermore, as shown in the figure, two element separating parts 31a and 31b separate a pixel provided therebetween from other adjacent pixels.

Then, as shown in C of FIG. 1, when viewed cross-sectionally, the protrusion part 33 includes a plurality of inclined surfaces 41 to 44 that is inclined with respect to the trench side surface 32 forming the element separating part 31.

For example, the inclined surfaces 41 and 42 are formed at a predetermined inclination angle with respect to a bottom surface when the semiconductor substrate 11 is vertically dug to form the trench (for example, surface that becomes the flat part 23 in the element separating part 21) so as to extend in a slanting direction on a far side of the trench. Furthermore, the inclined surfaces 43 and 44 are formed at a predetermined inclination angle with respect to the bottom surface when the semiconductor substrate 11 is vertically dug to form the trench so as to extend in a slanting direction on an opening side of the trench.

Specifically, the protrusion part 33 can be formed to have a substantially rhombic shape by performing silicon plane orientation selective etching using an alkaline chemical solution on a silicon substrate (100) such that a silicon plane (111) having a low etching rate is exposed. With this operation, for example, the inclined surfaces 41 and 42 are formed at an inclination angle of 54.7° with respect to the bottom surface when the semiconductor substrate 11 is vertically dug to form the trench. That is, the protrusion part 33 includes the inclined surfaces 41 to 44 that are inclined along the plane orientation of the silicon plane (111) of a silicon crystal constituting the semiconductor substrate 11.

Then, in A and B of FIG. 1, light incident on the semiconductor substrate 11 is represented by a broken arrow.

As shown in A of FIG. 1, in a certain pixel, light traveling along the element separating part 21 in the semiconductor substrate 11 is refracted at the tip portion of the element separating part 21 in a direction of another pixel adjacent to the pixel. Therefore, in a solid-state image capturing element including the element separating part 21, color mixing (crosstalk) occurs resulting from light leaking to another pixel.

In contrast, as shown in B of FIG. 1, in a certain pixel, light traveling along the element separating part 31 in the semiconductor substrate 11 is refracted at the protrusion part 33 of the element separating part 31 in a direction of the pixel itself. Therefore, in the solid-state image capturing element including the element separating part 31, it is possible to prevent light from leaking to another pixel and inhibit the occurrence of color mixing.

<Two-Dimensional Arrangement Example of Element Separating Part>

Figure 2:
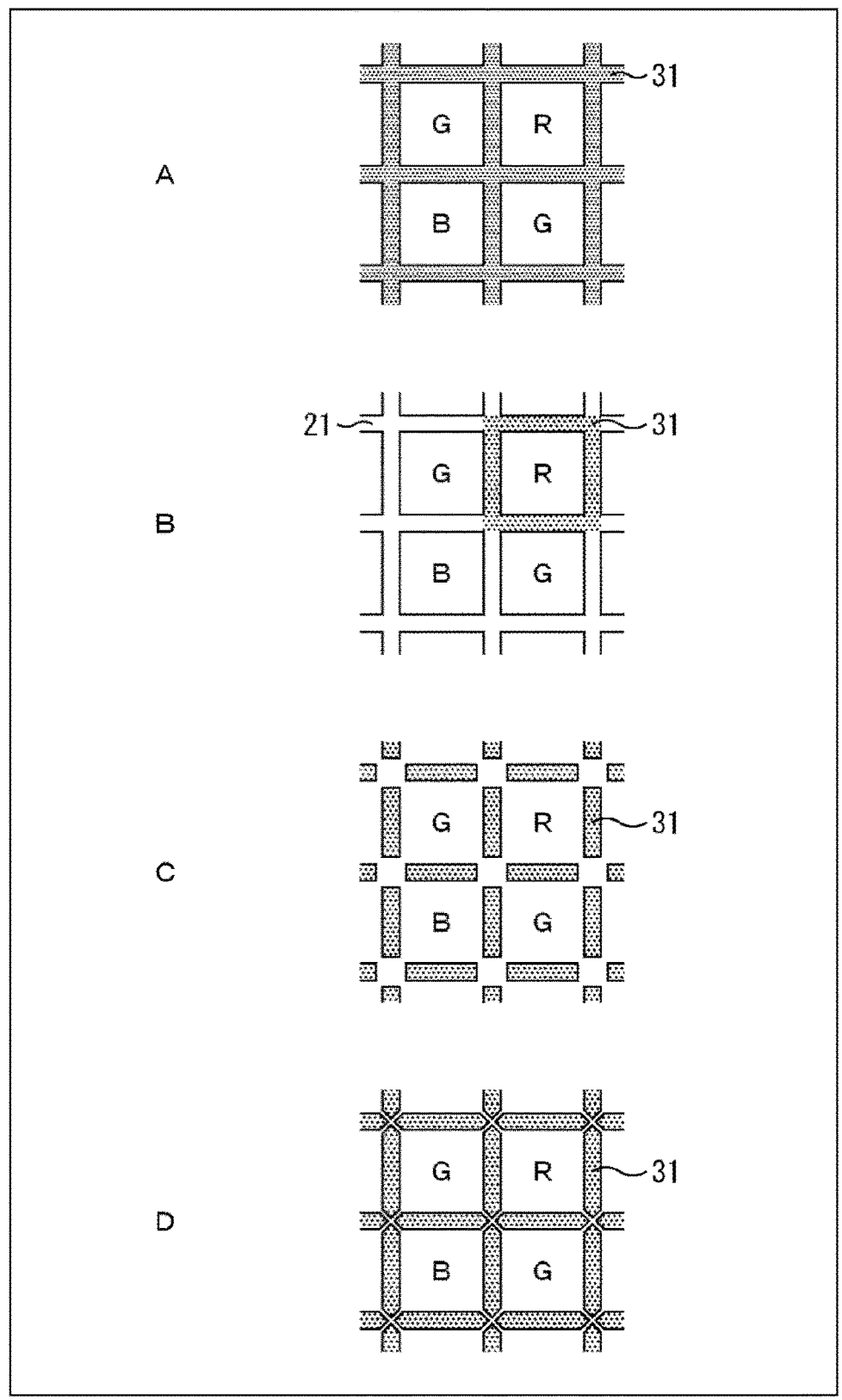
FIG. 2 is a diagram showing a two-dimensional arrangement example of the element separating part.

With reference to FIG. 2, two-dimensional arrangement of the element separating part 31 including the protrusion part 33 will be described.

A plurality of pixels that receives light transmitted through a color filter is arranged in a matrix on a light receiving surface of the solid-state image capturing element. FIG. 2 shows an example in which one pixel R that receives red light, two pixels G that receive green light, and one pixel B that receives blue light are arranged in 2×2 according to the so-called Bayer array.

For example, as shown in A of FIG. 2, the element separating part 31 including the protrusion part 33 can be arranged in a grid pattern at boundaries of a plurality of pixels so as to separate all of the pixels R, G, and B.

Furthermore, as shown in B of FIG. 2, the element separating part 31 including the protrusion part 33 can be arranged to surround the pixel R among the pixel R, the pixel G, and the pixel B. In such an arrangement example, the element separating part 21 including the flat part 23 is arranged other than around the pixel R. That is, red light reaches deep into the semiconductor substrate 11, thereby easily causing color mixing. By arranging the element separating part 31 including the protrusion part 33 so as to surround at least the pixel R, the occurrence of color mixing can be reduced.

Furthermore, as shown in C and D of FIG. 2, the element separating part 31 including the protrusion part 33 can be formed so as not to be continuous at intersections of a grid shape that are boundaries of a plurality of pixels but to be discontinuous at the intersections. For example, to inhibit the micro loading effect due to a difference in etching speed at the intersection, it is preferable to form the element separating part 31 so as to be discontinuous at the intersection in this way.

The element separating part 31 shown in C of FIG. 2 is formed such that both end portions have a flat shape when viewed two-dimensionally, and has a shape that prevents the element separating parts 31 from overlapping each other at the intersection. The element separating part 31 shown in C of FIG. 2 is formed to have a projecting shape such that both end portions are inclined at about 45 degrees when viewed two-dimensionally, and has a shape that reduces an overlapping part of the element separating parts 31 at the intersection.

Note that other than the arrangement example shown in FIG. 2, for example, in a case where pixels exist in a single line or point, without considering the micro loading effect, the element separating part 31 can be formed continuously so as to surround the individual pixel (for example, so as not to be discontinuous at the intersection as shown in B and C of FIG. 2).

<Configuration Example of Image Capturing Element>

With reference to FIGS. 3 to 14, configuration examples of an image capturing element including the element separating part 31 having the protrusion part 33 will be described.

Figure 3:
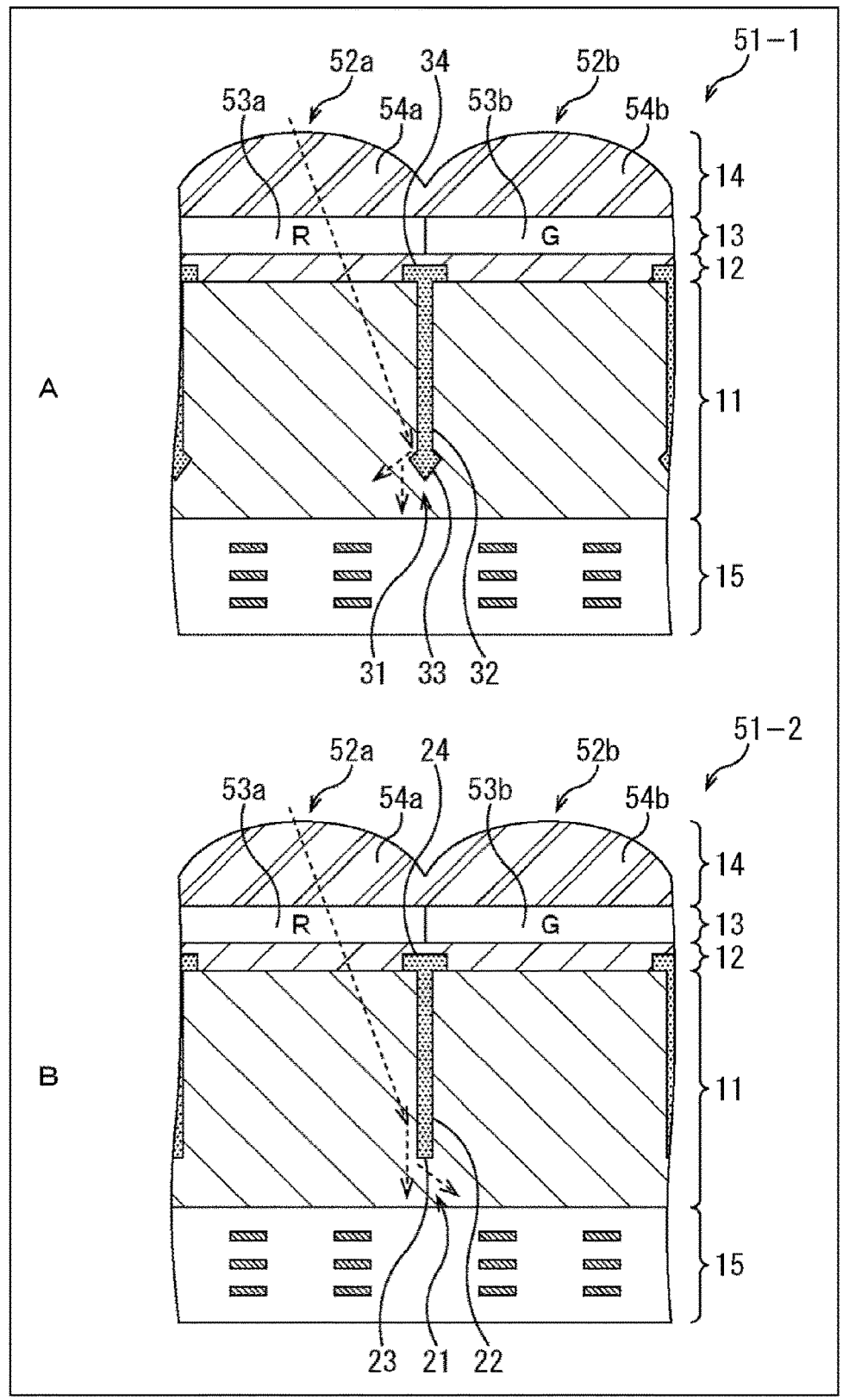
FIG. 3 is a cross-sectional view representing a first configuration example of the image capturing element.

FIG. 3 shows a cross-sectional view representing a first configuration example of the image capturing element.

As shown in FIG. 3, an image capturing element 51 has a configuration in which a flattening film 12, a filter layer 13, and an on-chip lens layer 14 are laminated on the back surface side of the semiconductor substrate 11, and a wiring layer 15 is laminated on the front surface side of the semiconductor substrate 11. That is, the image capturing element 51 is a backlit type in which light is applied to the back surface of the semiconductor substrate 11. Here, the semiconductor substrate 11 includes, for example, a Si{111} substrate. The Si{111} substrate is a single crystal silicon substrate having a crystal orientation of {111}.

Furthermore, the image capturing element 51 has a configuration in which a plurality of pixels 52 is arranged in a matrix when viewed two-dimensionally, and FIG. 3 shows cross sections of two of the pixels 52, pixels 52a and 52b. Furthermore, in the image capturing element 51, a color filter 53 is arranged in the filter layer 13, and a micro lens 54 is arranged in the on-chip lens layer 14 in every pixel 52.

Then, as shown in A of FIG. 3, the image capturing element 51-1 has a configuration in which the pixel 52a and the pixel 52b are separated by the element separating part 31 including the protrusion part 33. As described above with reference to B of FIG. 1, the element separating part 31 includes the rhombic protrusion part 33 formed by digging the trench to form the trench side surface 32 perpendicular to the back surface of the semiconductor substrate 11, and performing silicon plane orientation selective etching using an alkaline chemical solution on the tip portion of the trench. Furthermore, the element separating part 31 has a structure including a light-shielding part 34 that is formed by embedding a desired material such as metal into the trench, and the material is formed two-dimensionally on the back surface of the semiconductor substrate 11.

In this way, in the image capturing element 51-1 having a structure in which adjacent pixels 52 are separated from each other by the element separating part 31, light incident on the pixel 52a (broken arrow) is refracted in a direction of the pixel 52a by the protrusion part 33 of the element separating part 31. Therefore, the image capturing element 51-1 can prevent light from leaking from the pixel 52a to the pixel 52b, that is, prevent the occurrence of color mixing.

Meanwhile, B of FIG. 3 shows the image capturing element 51-2 having a structure in which the element separating part 21 including the flat part 23 separates the adjacent pixels 52 from each other. Furthermore, the element separating part 21 has a structure having a light-shielding part 24 in a similar manner to the element separating part 31. Then, in the image capturing element 51-2, as shown in the figure, light leaks to another adjacent pixel 52 at the tip portion of the element separating part 21.

Therefore, the image capturing element 51-1 can inhibit deterioration of image quality due to the occurrence of color mixing better than the image capturing element 51-2, and can capture a higher-quality image.

Figure 4:
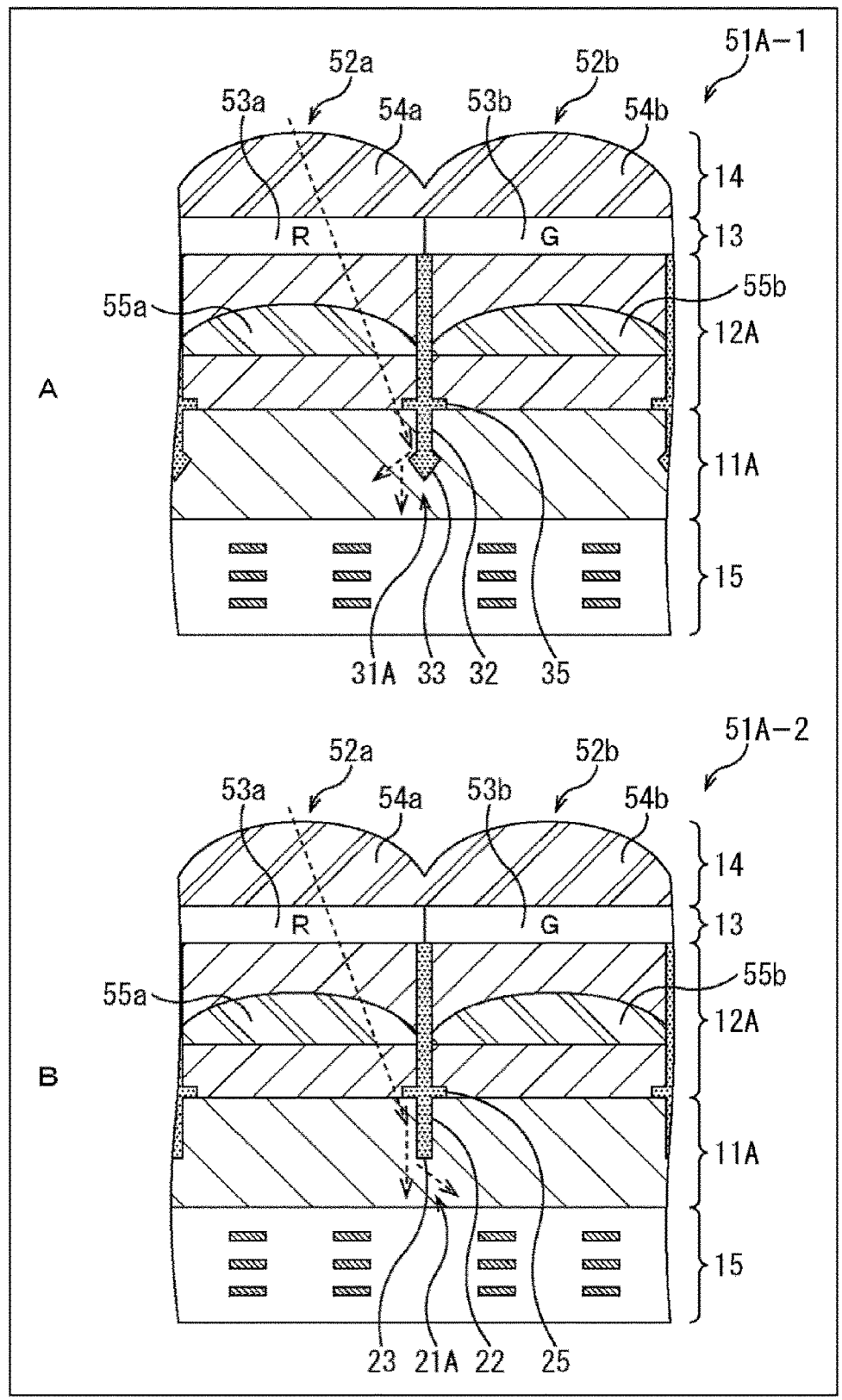
FIG. 4 is a cross-sectional view representing a second configuration example of the image capturing element.

FIG. 4 shows a cross-sectional view representing a second configuration example of the image capturing element. Note that in an image capturing element 51A shown in FIG. 4, configurations common to the image capturing element 51 of FIG. 3 are denoted with the same reference symbol, and detailed description thereof will be omitted.

As shown in FIG. 4, the image capturing elements 51A-1 and 51A-2 have a different configuration from the image capturing elements 51-1 and 51-2 of FIG. 3 in that an inner lens 55 is formed in every pixel 52 inside a flattening film 12A laminated on a semiconductor substrate 11A. Furthermore, the trench side surface 32 and the protrusion part 33 are formed by digging the semiconductor substrate 11A, a light-shielding part 35 is formed on the back surface of the semiconductor substrate 11A, and an element separating part 31A is formed between the inner lenses 55 from the light-shielding part 34 to the filter layer 13.

Therefore, as shown in A of FIG. 4, the image capturing element 51A-1 can prevent light from leaking from the pixel 52a to the pixel 52b by the element separating part 31A.

Meanwhile, as shown in B of FIG. 4, in the image capturing element 51A-2, light leaks to another adjacent pixel 52 at the tip portion of the element separating part 21A.

The image capturing element 51A-1 configured in this way can inhibit deterioration of image quality due to the occurrence of color mixing in a similar manner to the image capturing element 51-1 of FIG. 3, and can capture a higher-quality image.

Figure 5:
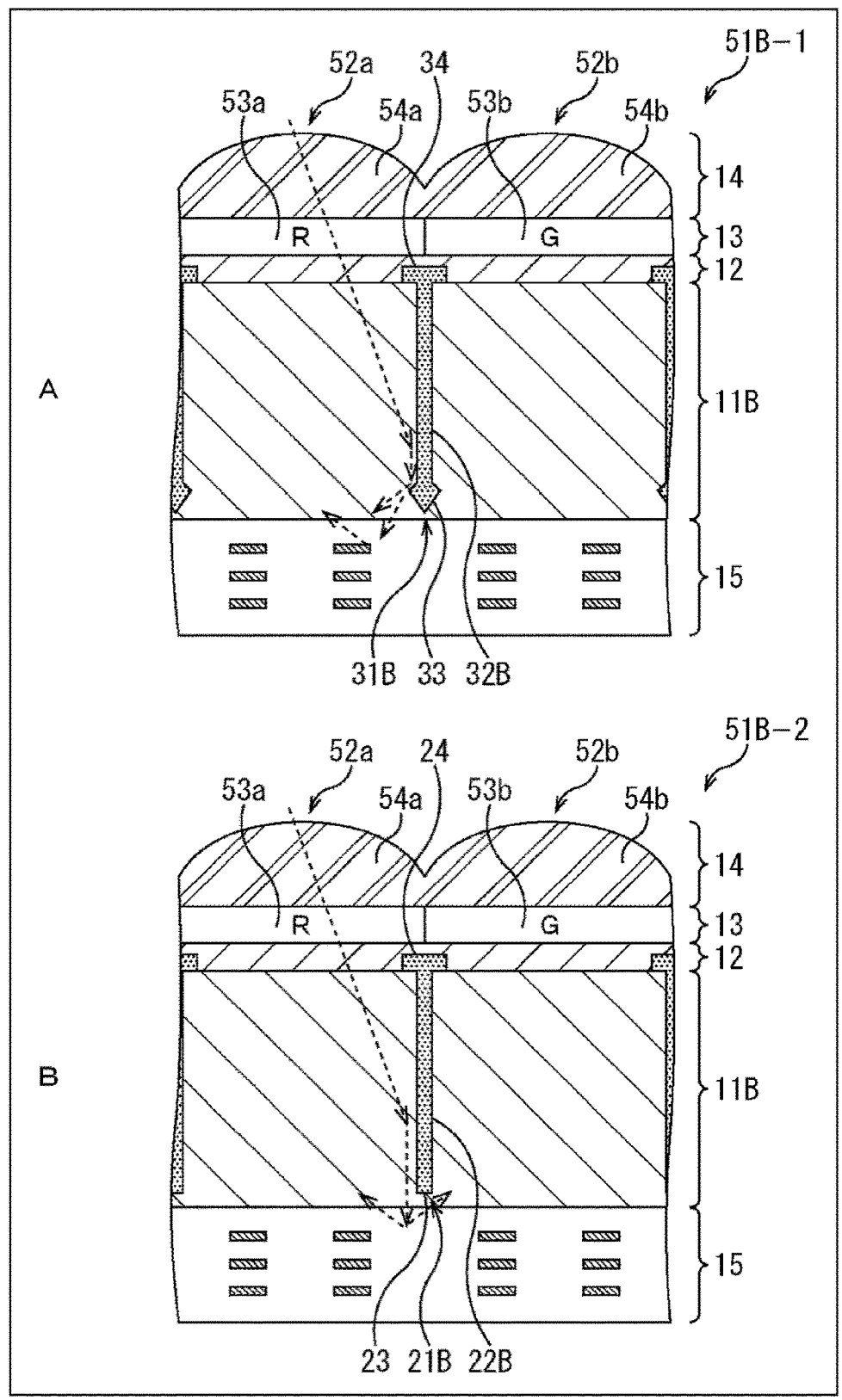
FIG. 5 is a cross-sectional view representing a third configuration example of the image capturing element.

FIG. 5 shows a cross-sectional view representing a third configuration example of the image capturing element. Note that in the image capturing element 51B shown in FIG. 5, configurations common to the image capturing element 51 of FIG. 3 are denoted with the same reference symbol, and detailed description thereof will be omitted.

As shown in FIG. 5, an image capturing element 51B-1 has a different configuration from the image capturing element 51-1 of FIG. 3 in that an element separating part 31B is formed up to a vicinity of the wiring layer 15 in a semiconductor substrate 11B.

Therefore, like the light represented by a broken arrow in A of FIG. 5, in the image capturing element 51B-1, light incident on the pixel 52a (broken arrow) is refracted in a direction of the pixel 52a by the protrusion part 33 of the element separating part 31. Moreover, in the image capturing element 51B-1, since the element separating part 31B is formed up to the vicinity of the wiring layer 15, it is possible to make it difficult for the light incident on the pixel 52a to hit a wire near the adjacent pixel 52b. With this operation, the image capturing element 51B-1 can prevent light from leaking from the pixel 52a to the pixel 52b more certainly, that is, improve the effect of preventing the occurrence of color mixing.

Furthermore, as shown in B of FIG. 5, even in an image capturing element 51B-2, an element separating part 21B is formed up to the vicinity of the wiring layer 15.

However, in the image capturing element 51B-2, as shown in the figure, light hits a wire near the adjacent pixel 52b at the tip portion of the element separating part 21B, is scattered by the wire, and scattered light is incident on the adjacent pixel 52b.

The image capturing element 51B-1 configured in this way can inhibit deterioration of image quality due to the occurrence of color mixing in a similar manner to the image capturing element 51-1 of FIG. 3, and can capture a higher-quality image.

Figure 6:
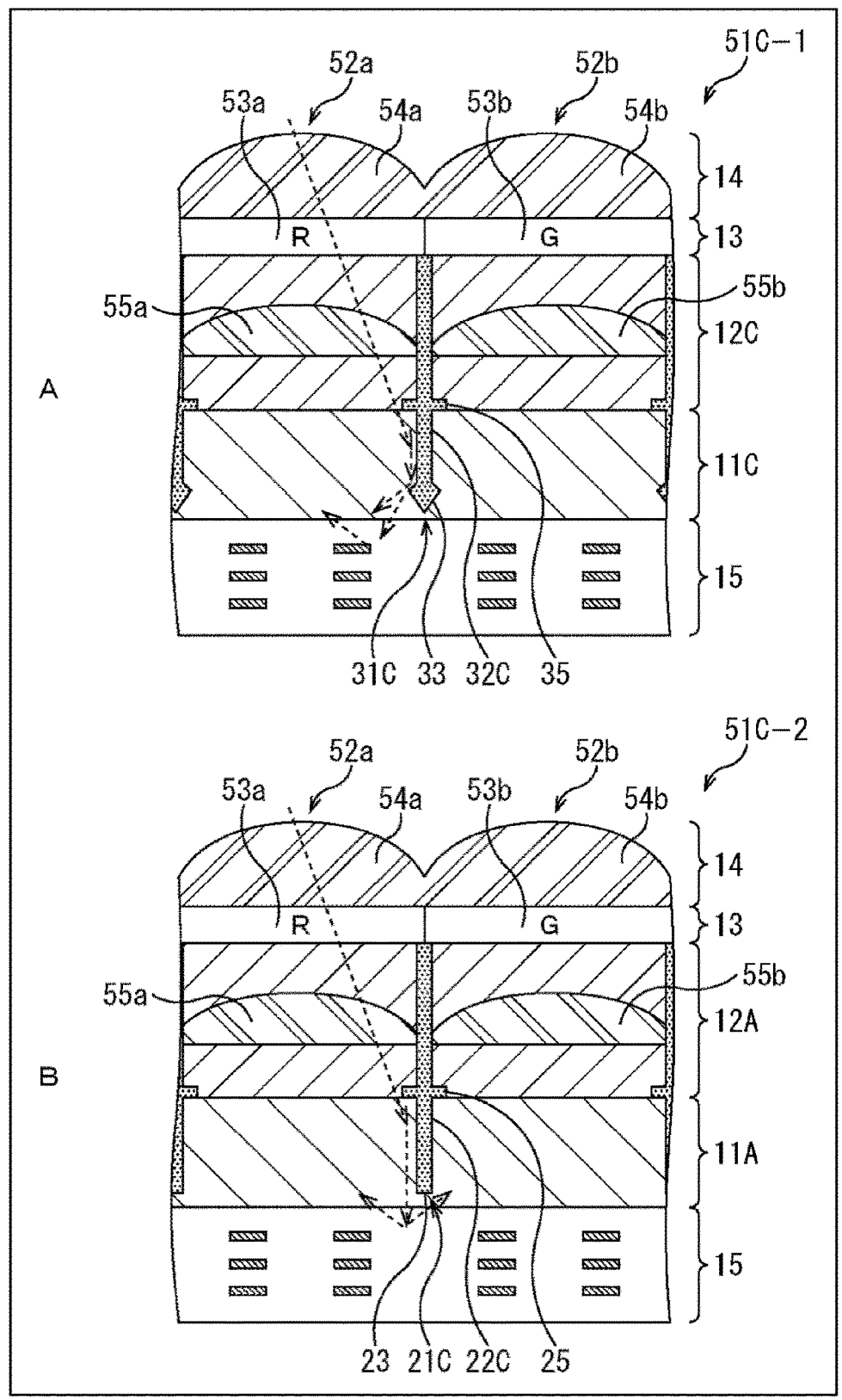
FIG. 6 is a cross-sectional view representing a fourth configuration example of the image capturing element.

FIG. 6 shows a cross-sectional view representing a fourth configuration example of the image capturing element. Note that in the image capturing element 51C shown in FIG. 6, configurations common to the image capturing element 51A of FIG. 4 are denoted with the same reference symbol, and detailed description thereof will be omitted.

That is, in image capturing elements 51C-1 and 51C-2, the inner lens 55 is formed in every pixel 52, in a similar manner to the image capturing elements 51A-1 and 51A-2. Moreover, in the image capturing element 51C-1, an element separating part 31C is formed up to the vicinity of the wiring layer 15 in a semiconductor substrate 11C in a similar manner to the image capturing element 51B-1 of FIG. 5.

The image capturing element 51C-1 configured in this way can inhibit deterioration of image quality due to the occurrence of color mixing in a similar manner to the image capturing element 51A-1 of FIG. 3 and the image capturing element 51B-1 of FIG. 5, and can capture a higher-quality image.

Figure 7:
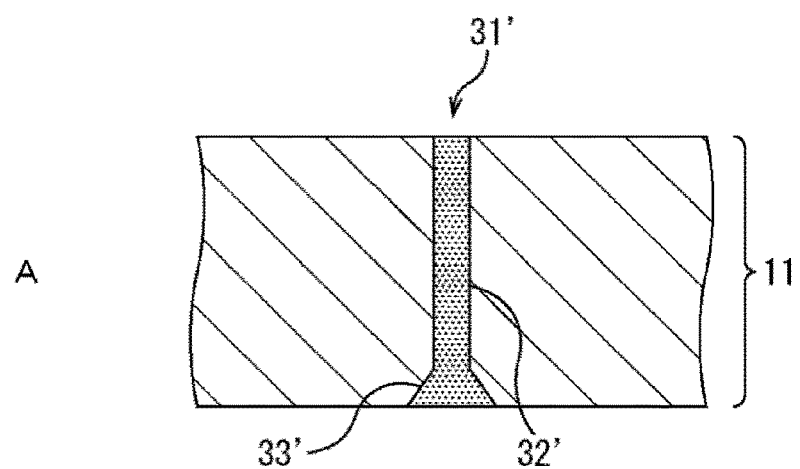
FIG. 7 is a diagram showing a modification of the element separating part.
Figure 7:
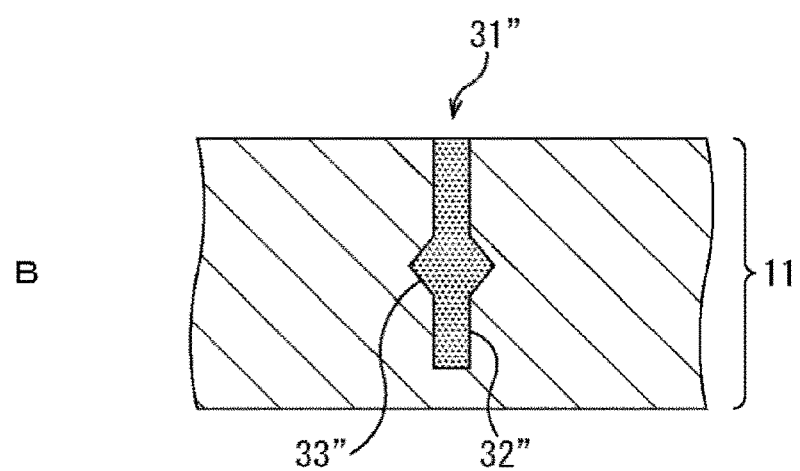

Here, FIG. 7 shows a modification of the element separating part 31.

An element separating part 31' shown in A of FIG. 7 includes a trench side surface 32' formed so as to penetrate the semiconductor substrate 11, and includes a substantially triangular-shaped (for example, the shape of only the inclined surfaces 43 and 44 of C of FIG. 1) protrusion part 33' at a tip portion of the element separating part 31'. That is, the protrusion part 33 is not limited to the substantially rhombic shape, and various shapes can be adopted as long as the shape projects in a side surface direction from the trench side surface 32.

An element separating part 31" shown in B of FIG. 7 includes a substantially rhombic protrusion part 33" in the middle stage of a trench side surface 32" formed by digging the semiconductor substrate 11. That is, the protrusion part 33 is not limited to being formed in the tip portion of the element separating part 31, but is required at least to have a configuration of being provided between the light receiving surface of the semiconductor substrate 11 and the tip of the element separating part 31" (that is, bottom of the trench).

Even in the element separating part 31' and the element separating part 31" of such a shape, in a similar manner to the element separating part 31 described above, it is possible to prevent the light incident on the semiconductor substrate 11 from leaking to another pixel, and to inhibit the occurrence of color mixing.

Figure 8:
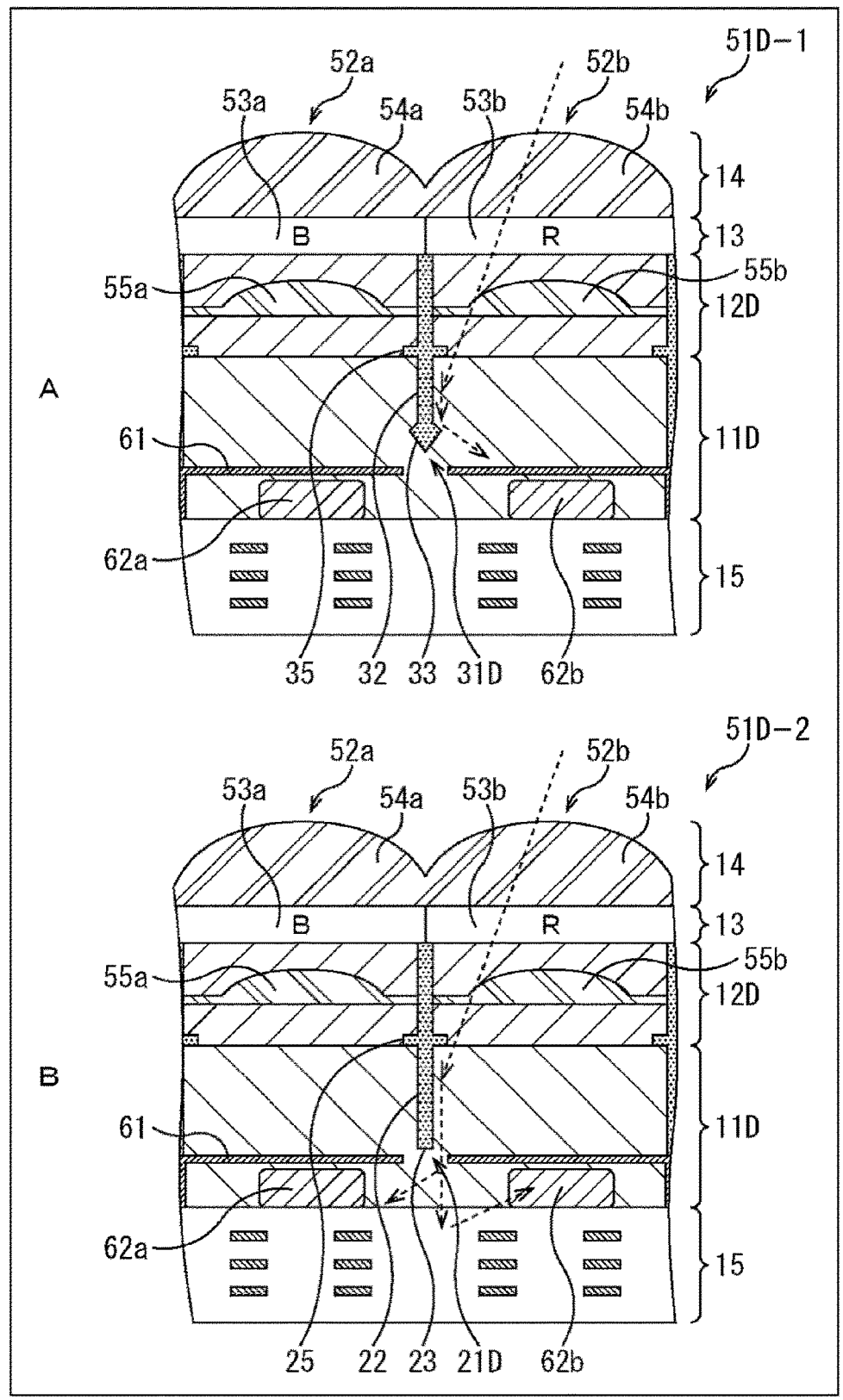
FIG. 8 is a cross-sectional view representing a fifth configuration example of the image capturing element.

FIG. 8 shows a cross-sectional view representing a fifth configuration example of the image capturing element. Note that in an image capturing element 51D shown in FIG. 8, configurations common to the image capturing element 51A of FIG. 4 are denoted with the same reference symbol, and detailed description thereof will be omitted.

That is, the image capturing element 51D shown in FIG. 8 has a global shutter function of transferring a charge from a photodiode to a charge storage unit 62 at substantially the same timing in all pixels, and has a configuration in which the photodiode and the charge storage unit 62 are arranged vertically. Then, the image capturing element 51D has a configuration in which the charge storage unit 62 is shielded from light by a light-shielding wall 61 extending in a horizontal direction inside a semiconductor substrate 11D, and the charge storage unit 62 and the photodiode are separated from each other. Furthermore, an opening for providing a vertical transistor (not shown) for transferring a charge from the photodiode to the charge storage unit 62 is provided in the light-shielding wall 61.

Therefore, like the light represented by a broken arrow in A of FIG. 8, the image capturing element 51D-1 can prevent light from leaking to the charge storage unit 62 by reflecting the light reflected by an element separating part 31D toward the horizontal light-shielding wall 61.

Meanwhile, as shown in B of FIG. 8, in an image capturing element 51D-2, light propagating along an element separating part 21D reaches the charge storage unit 62.

In the image capturing element 51D-1 configured in this way, it is possible to prevent the stored charge of the charge storage unit 62 from increasing by preventing light from leaking to the charge storage unit 62, and to certainly implement the global shutter function.

Figure 9:
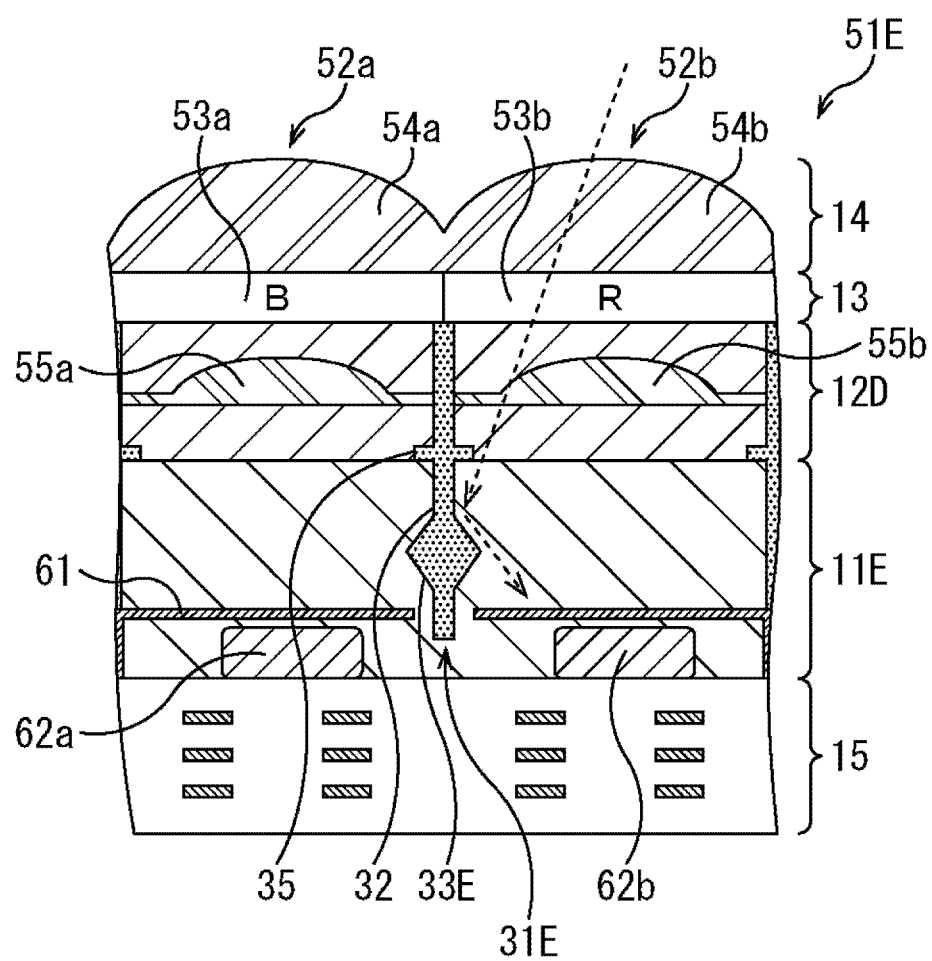
FIG. 9 is a cross-sectional view representing a sixth configuration example of the image capturing element.

FIG. 9 shows a cross-sectional view representing a sixth configuration example of the image capturing element. Note that in an image capturing element 51E shown in FIG. 9, configurations common to the image capturing element 51D of FIG. 8 are denoted with the same reference symbol, and detailed description thereof will be omitted.

That is, the image capturing element 51E has a global shutter function in a similar manner to the image capturing element 51D of FIG. 8, and an opening for providing a vertical transistor (not shown) for transferring a charge from the photodiode to the charge storage unit 62 is provided in the light-shielding wall 61.

Then, in the image capturing element 51E, a protrusion part 33E of an element separating part 31E is formed in the middle stage of the trench side surface 32 such that the horizontal size of the protrusion part 33E is larger than the opening of the light-shielding wall 61.

Figure 10:
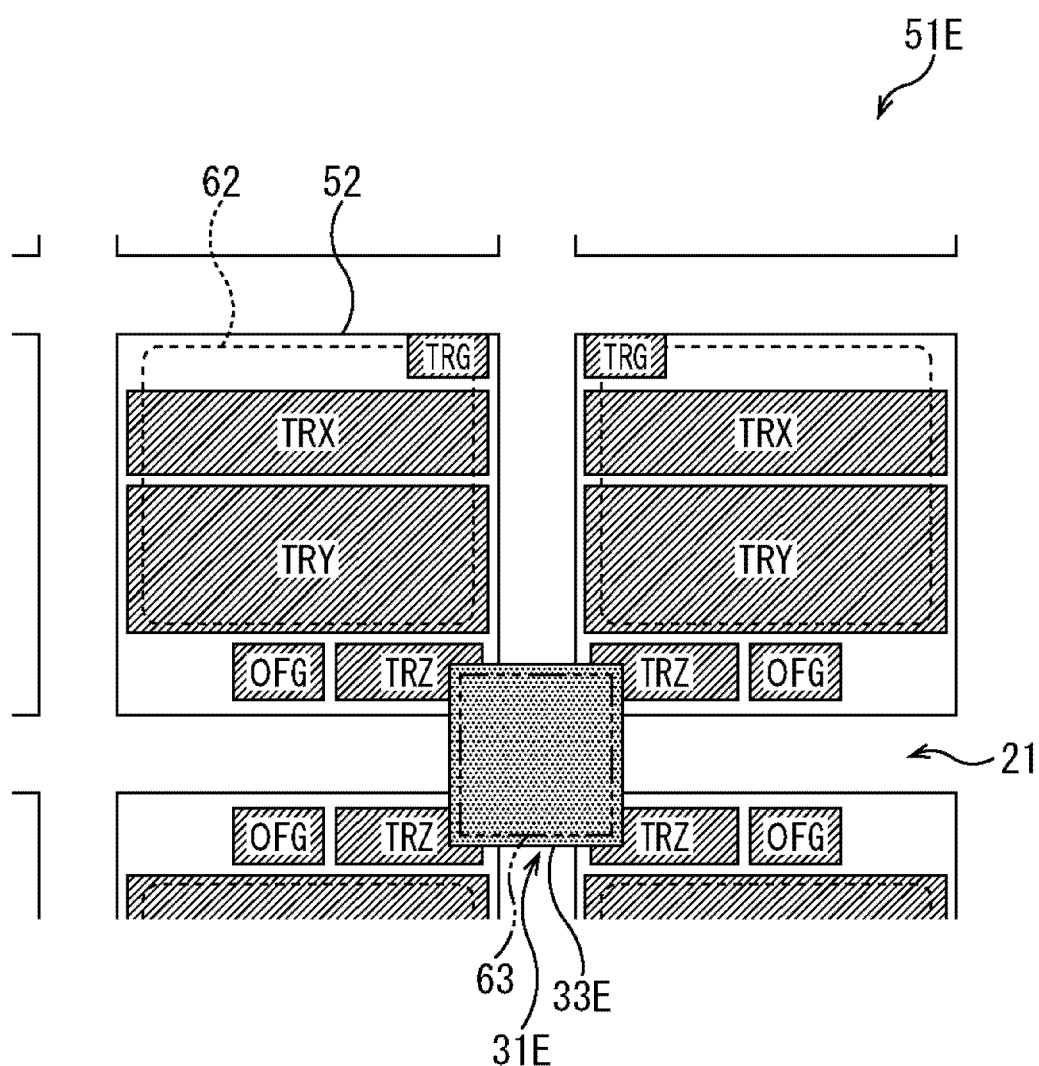
FIG. 10 is a diagram describing a relationship between a protrusion part and an opening when viewed two-dimensionally.

That is, as shown in FIG. 10, when the image capturing element 51E is viewed two-dimensionally, the protrusion part 33E of the element separating part 31E is formed to be wider than the opening 63 of the light-shielding wall 61. Note that in a region other than the opening 63 of the light-shielding wall 61, the image capturing element 51E is configured to separate adjacent pixels 52 by the element separating part 21 including the flat part 23.

With such a configuration, the image capturing element 51E can more certainly prevent light from leaking to the charge storage unit 62 than the image capturing element 51D of FIG. 8.

Figure 11:
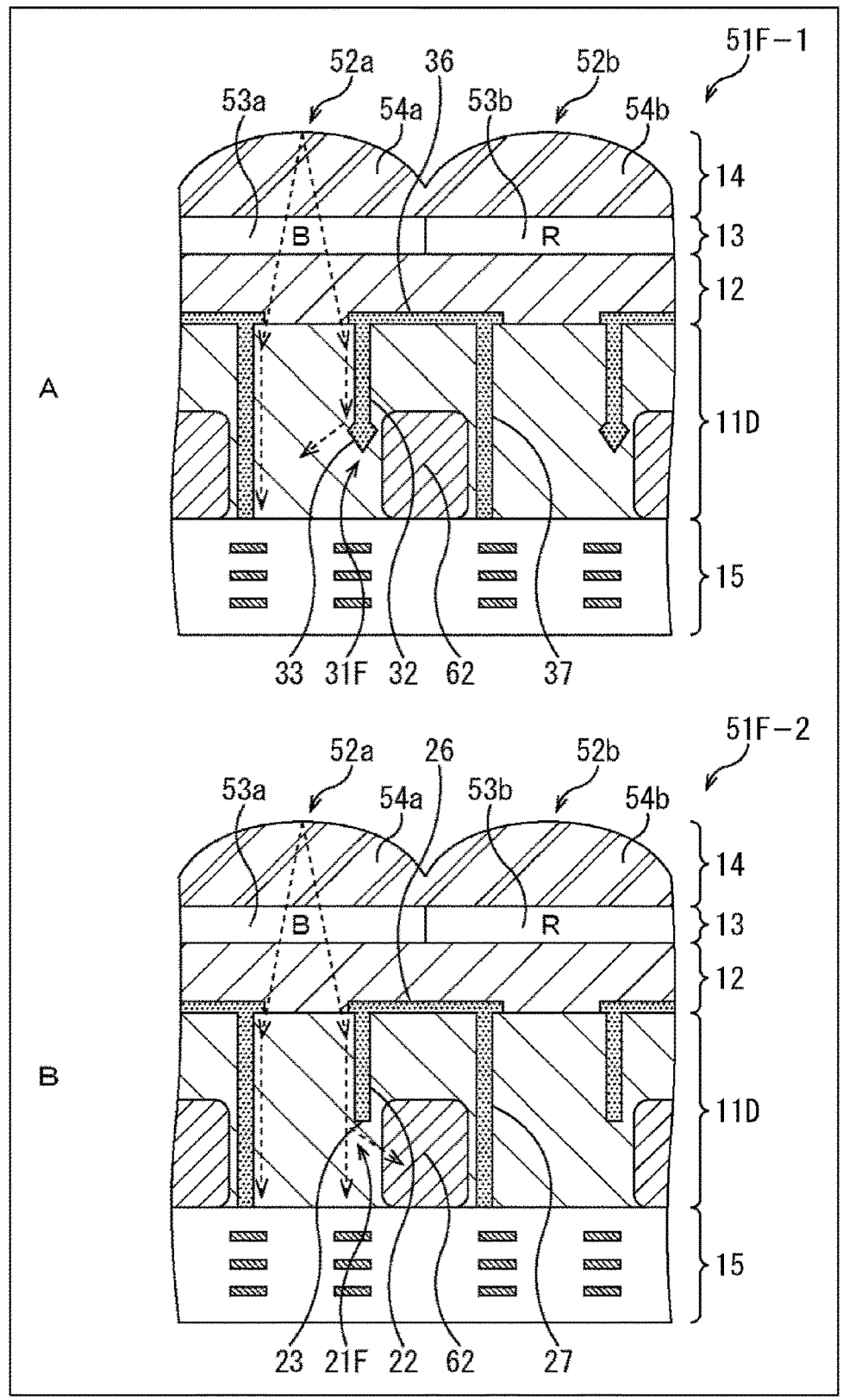
FIG. 11 is a cross-sectional view representing a seventh configuration example of the image capturing element.

FIG. 11 shows a cross-sectional view representing a seventh configuration example of the image capturing element. Note that in the image capturing element 51F shown in FIG. 11, configurations common to the image capturing element 51 of FIG. 3 are denoted with the same reference symbol, and detailed description thereof will be omitted.

The image capturing element 51F has a global shutter function, and has a configuration in which the photodiode and the charge storage unit 62 are arranged in a horizontal direction.

In the image capturing element 51F having such a configuration, the charge storage unit 62 is shielded from light by a light-shielding part 36 and a light-shielding wall 37, and the element separating part 31 including the protrusion part 33 is formed between the photodiode and the charge storage unit 62.

Therefore, like the light represented by a broken arrow in A of FIG. 11, an image capturing element 51F-1 can prevent light from leaking to the charge storage unit 62 by reflecting the light reflected by an element separating part 31F toward the photodiode side.

Meanwhile, as shown in B of FIG. 11, in an image capturing element 51F-2, light propagating along an element separating part 21F including the flat part 23 is diffracted at the tip of the element separating part 21F and leaks to the charge storage unit 62.

In the image capturing element 51F-1 configured in this way, it is possible to prevent the stored charge of the charge storage unit 62 from increasing by preventing light from leaking to the charge storage unit 62, and to certainly implement the global shutter function.

Figure 12:
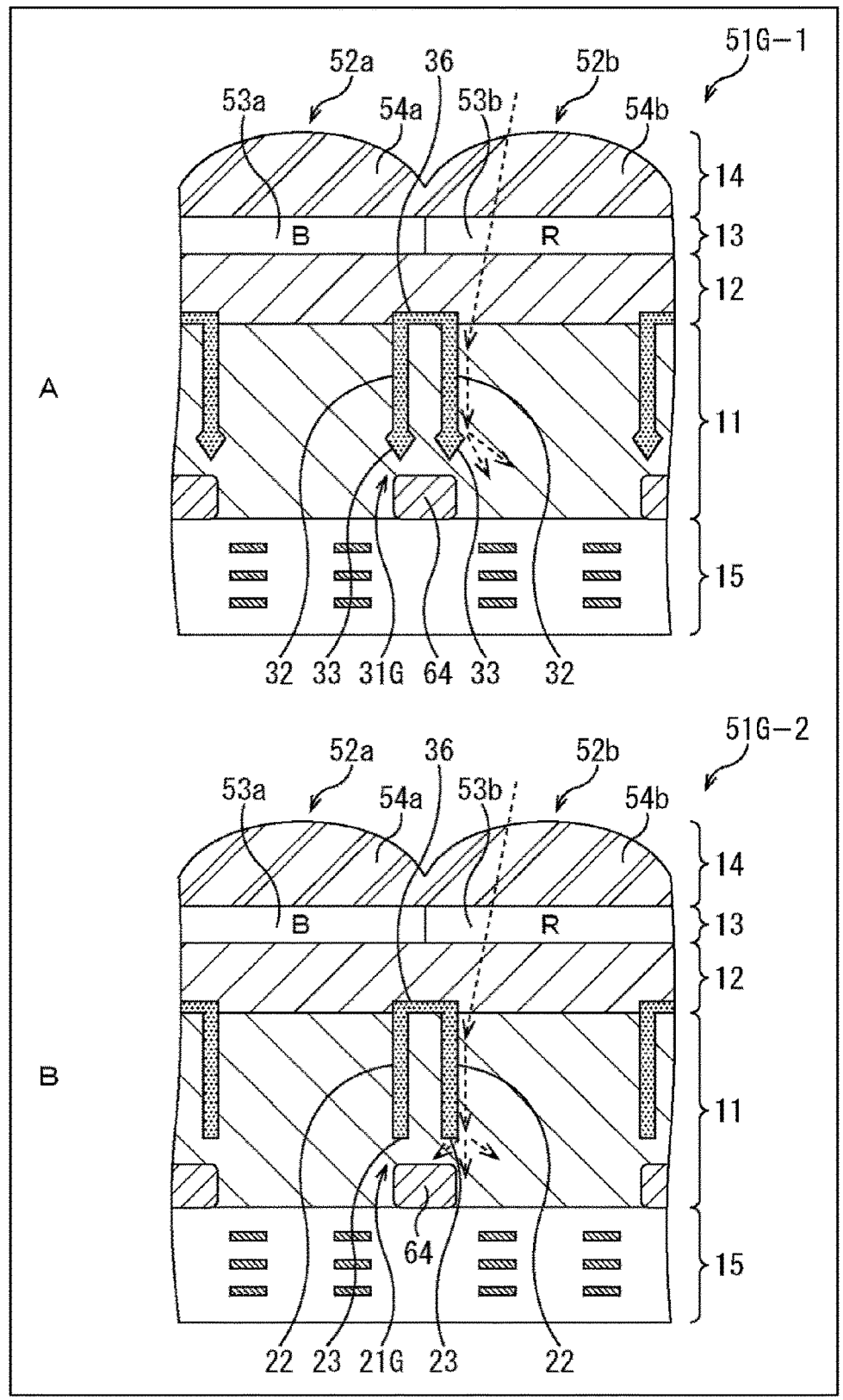
FIG. 12 is a cross-sectional view representing an eighth configuration example of the image capturing element.

FIG. 12 shows a cross-sectional view representing an eighth configuration example of the image capturing element. Note that in the image capturing element 51G shown in FIG. 12, configurations common to the image capturing element 51 of FIG. 3 are denoted with the same reference symbol, and detailed description thereof will be omitted.

The image capturing element 51G has a global shutter function, and a floating diffusion (FD) part 64 is used as a charge storage unit that stores a charge transferred from the photodiode. Then, in the image capturing element 51G, the light-shielding part 36 is provided so as to shield the FD part 64 from light, and the element separating part 31 including the protrusion part 33 is formed so as to surround the FD part 64 from the light-shielding part 36.

Therefore, like the light represented by a broken arrow in A of FIG. 12, an image capturing element 51G-1 can prevent light from leaking to the FD part 64 by reflecting the light reflected by an element separating part 31G toward the photodiode side.

Meanwhile, as shown in B of FIG. 12, in an image capturing element 51G-2, light propagating along an element separating part 21G including the flat part 23 is diffracted at the tip of the element separating part 21G and leaks to the FD part 64.

In the image capturing element 51G-1 configured in this way, it is possible to prevent the stored charge of the FD part 64 from increasing by preventing light from leaking to the FD part 64, and to certainly implement the global shutter function.

Figure 13:
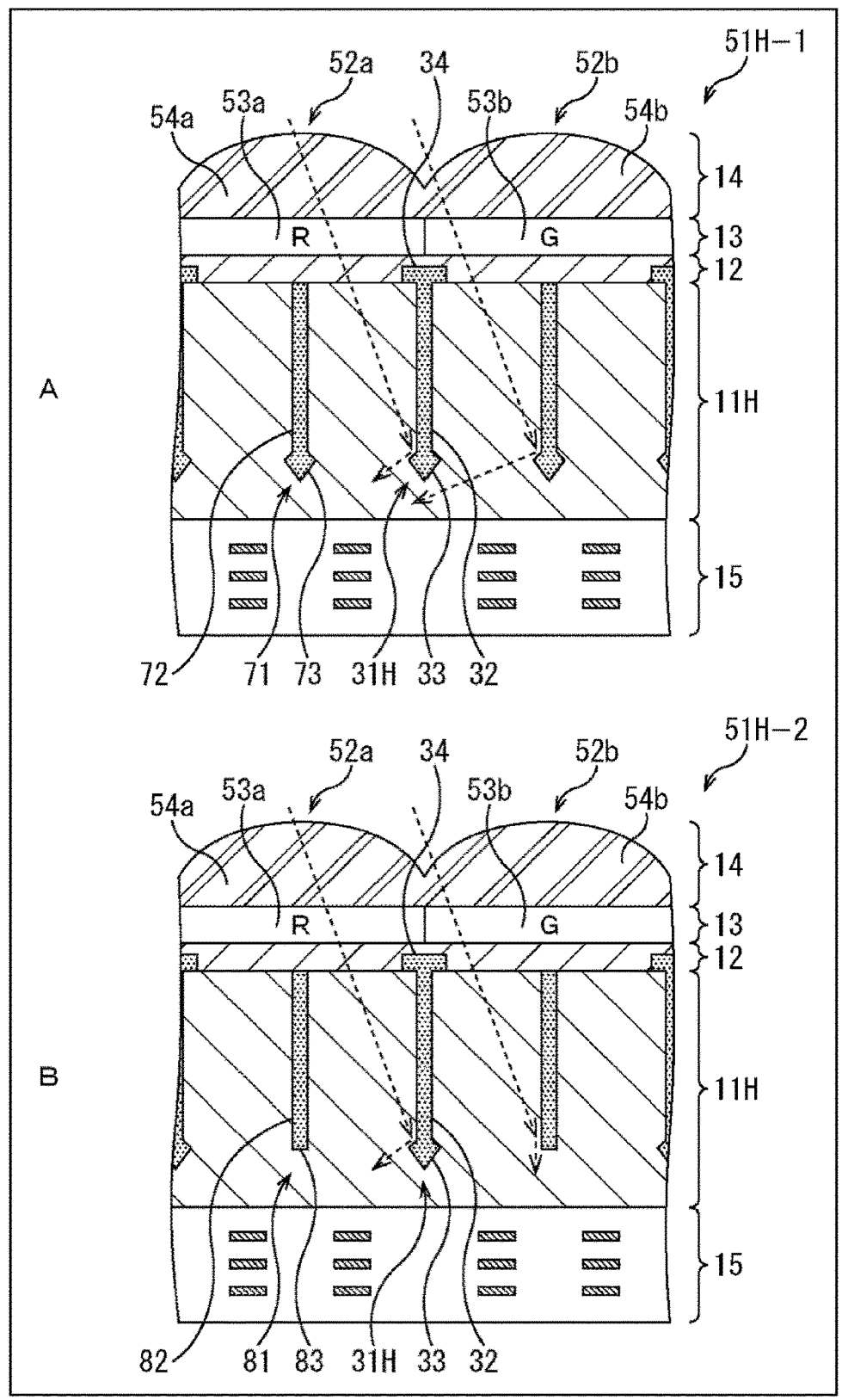
FIG. 13 is a cross-sectional view representing a ninth configuration example of the image capturing element.

FIG. 13 shows a cross-sectional view representing a ninth configuration example of the image capturing element. Note that in the image capturing element 51H shown in FIG. 13, configurations common to the image capturing element 51 of FIG. 3 are denoted with the same reference symbol, and detailed description thereof will be omitted.

The image capturing element 51H has a configuration in which two photodiodes are formed in one pixel 52. In addition to separating adjacent pixels 52 by the element separating part 31, the two photodiodes in the pixel 52 are also separated.

In a similar manner to the element separating part 31, A of FIG. 13 shows an image capturing element 51H-1 having a configuration in which two photodiodes in the pixel 52 are separated by an element separating part 71 including a protrusion part 73. Meanwhile, in a similar manner to the element separating part 21, B of FIG. 13 shows an image capturing element 51H-2 having a configuration in which two photodiodes in the pixel 52 are separated by an element separating part 81 including a flat part 83.

For example, like the light represented by a broken arrow in A of FIG. 12, in the image capturing element 51H-1, there is a concern that light reflected by the protrusion part 73 of the element separating part 71 that separates the photodiodes leaks to the adjacent pixel 52.

In contrast, like the light represented by a broken arrow in B of FIG. 12, in the image capturing element 51H-2, light reflected by the element separating part 81 that separates the photodiodes does not leak to the adjacent pixel 52.

Therefore, in a configuration in which two photodiodes are formed in one pixel 52 as in the image capturing element 51H-2, it is preferable to use the element separating part 81 including the flat part 83 to separate the photodiodes, and to use the element separating part 31 including the protrusion part 33 to separate the pixels 52 from each other.

Figure 14:
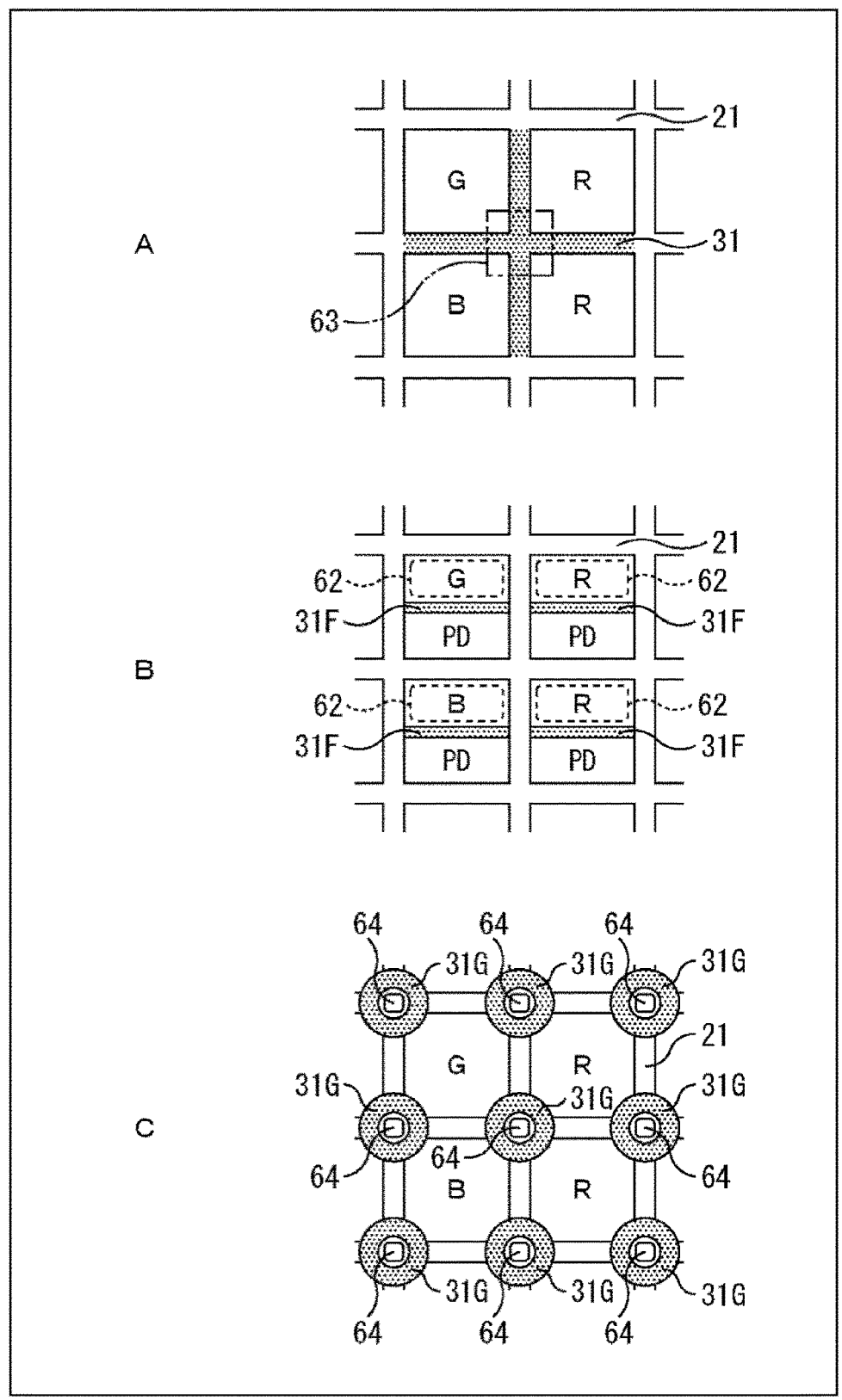
FIG. 14 is a diagram showing a two-dimensional arrangement example of the element separating part.

With reference to FIG. 14, two-dimensional arrangement of the element separating part 31 including the protrusion part 33 will be described.

Like the image capturing element 51E of FIG. 9 described above, A of FIG. 14 shows an arrangement example in which in the configuration in which the opening 63 is formed on the light-shielding wall 61, the element separating part 31 including the protrusion part 33 is arranged only at a place passing through the opening 63. Furthermore, in this arrangement example, the element separating part 21 including the flat part 23 is provided other than at the place passing through the opening 63.

In the configuration in which the photodiode PD and the charge storage unit 62 are arranged in a horizontal direction as in the image capturing element 51F of FIG. 11 described above, B of FIG. 14 shows an arrangement example in which the element separating part 31F including the protrusion part 33 is arranged only at a place where the photodiode PD and the charge storage unit 62 are separated. Furthermore, in this arrangement example, the element separating part 21 including the flat part 23 is provided between the pixels.

Like the image capturing element 51G of FIG. 12 described above, C of FIG. 14 shows an arrangement example in which in the configuration in which the FD part 64 is formed, the element separating part 31G including the protrusion part 33 is arranged only at a place surrounding the FD part 64. Furthermore, in this arrangement example, the element separating part 21 including the flat part 23 is provided between the Pixels.

<Manufacturing Method of Image Capturing Element>

With reference to FIGS. 15 to 23, a process of forming the element separating part 31 or the element separating part 21 in a manufacturing method of the image capturing element to which the present technology is applied will be described. Note that the following manufacturing method uses, as a semiconductor substrate, a Si {111} substrate with a thickness direction defined as a first direction and having a first crystal plane represented with a plane index {111} extending along a horizontal plane orthogonal to the first direction. Then, the inclined surface of the protrusion part is formed so as to include a plane along a second crystal plane of the Si {111} substrate represented by the plane index {111} and inclined with respect to the first direction by performing crystal anisotropy etching on the Si {111} substrate by using an etching solution. Furthermore, in the Si {111} substrate, an etching rate is sufficiently higher in the <110> direction, that is, in the direction of having one or two Si back bonds than the etching rate in the <111> direction, that is, in the direction of having three Si back bonds.

Figure 15:
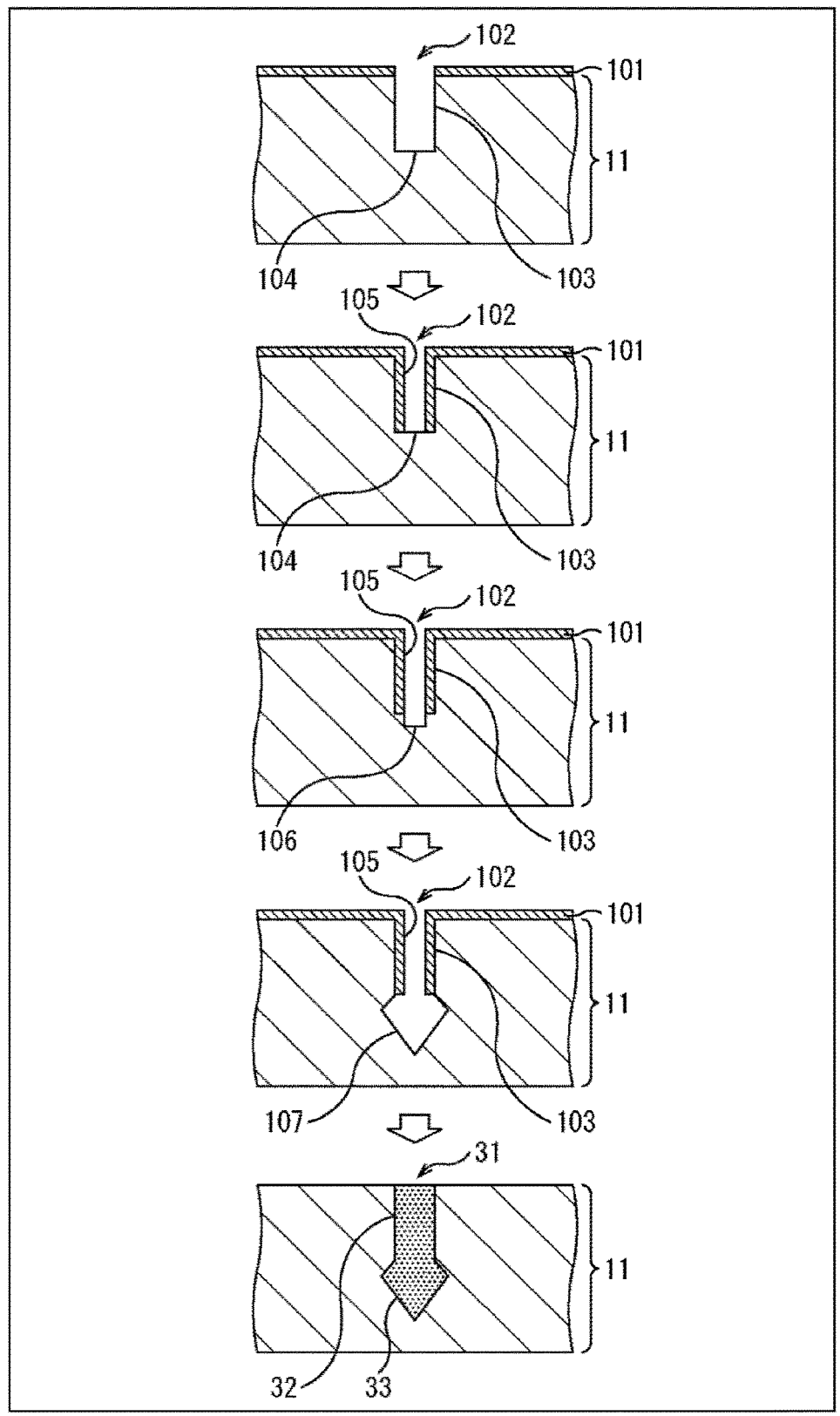
FIG. 15 is a diagram describing a first manufacturing method.

With reference to FIG. 15, a first manufacturing method will be described.

In the first step, as shown in the first row from the top of FIG. 15, a silicon nitride ($Si_3N_4$) film is formed on the entire back surface of the semiconductor substrate 11, and the silicon nitride film is removed only in a region where the trench 102 is formed, whereby a hard mask 101 is formed. Then, the trench 102 is processed by etching the semiconductor substrate 11 by using the hard mask 101. With this operation, a side surface 103 of the trench 102 is formed so as to be substantially perpendicular to the back surface of the semiconductor substrate 11, and a bottom surface 104 of the trench 102 is formed to be flat.

In the second step, as shown in the second row from the top of FIG. 15, a sidewall film 105 is formed on the side surface 103 of the trench 102. For example, by forming the silicon nitride film on the entire inner surface of the trench 102 and then etching back the bottom surface portion of the trench 102 to remove the silicon nitride film, the sidewall 105 is formed.

In the third step, as shown in the third row from the top of FIG. 15, etch back is performed on the semiconductor substrate 11 to dig down the bottom surface 104 of the trench 102 to form a bottom surface 106 of the trench 102 so as to be deeper than the sidewall 105. Note that the etch back in the third step may be optional.

In the fourth step, as shown in the fourth row from the top of FIG. 15, alkaline etching is performed on the semiconductor substrate 11 to form a projection part 107 extending in a rhombic shape at the bottom of the trench 102. That is, by performing silicon plane orientation selective etching using an alkaline chemical solution such that a silicon surface (111) having a low etching rate is exposed, the projection part 107 of the trench 102 can be formed in a rhombic shape extending more than the side surface 103.

In the fifth step, as shown in the fifth row from the top of FIG. 15, by embedding a desired material such as metal in the trench 102, the element separating part 31 including the rhombic protrusion part 33 projecting in the side surface direction from the trench side surface 32 is formed.

Figure 16:
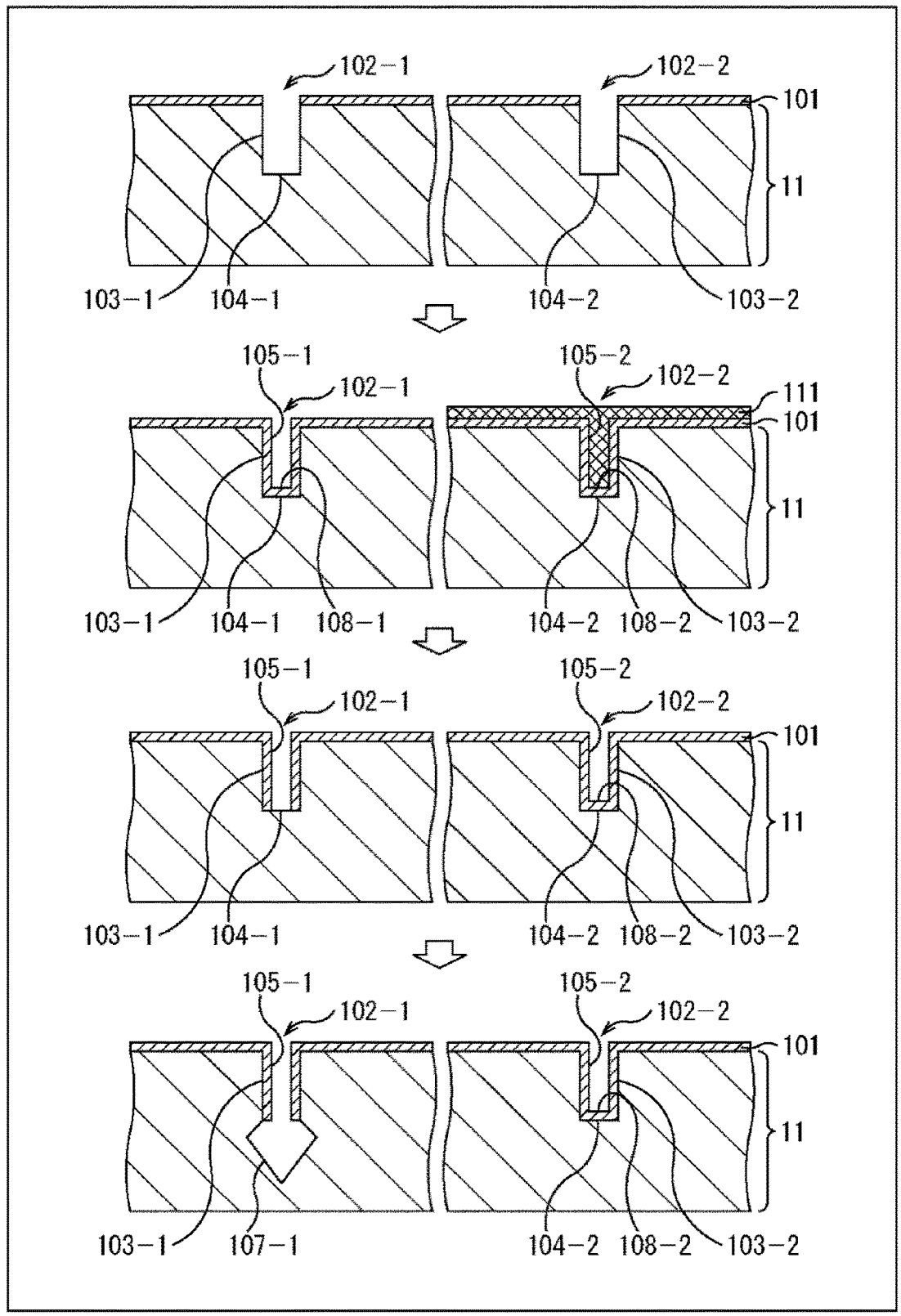
FIG. 16 is a diagram describing a second manufacturing method.

With reference to FIG. 16, a second manufacturing method will be described. For example, the second manufacturing method is a manufacturing method of separately making the element separating part 31 including the protrusion part 33 and the element separating part 21 including the flat part 23.

In the eleventh step, as shown in the first row from the top of FIG. 16, trenches 102-1 and 102-2 are processed in a similar manner to the first step of FIG. 15 described above.

In the twelfth step, as shown in the second row from the top of FIG. 16, a silicon nitride film is formed on the entire inner surface of the trenches 102-1 and 102-2. With this operation, a sidewall 105-1 is formed on a side surface 103-1 of the trench 102-1, and a mask 108-1 is formed on a bottom surface 104-1 of the trench 102-1. Simultaneously, a sidewall 105-2 is formed on a side surface 103-2 of the trench 102-2, and a mask 108-2 is formed on a bottom surface 104-2 of the trench 102-2. Moreover, a resist 111 is applied so as to be embedded in the trench 102-2.

In the 13th step, as shown in the third row from the top of FIG. 16, the bottom surface portion of the trench 102-1 is etched back to remove the mask 108-1, and then the resist 111 is removed. With this operation, the semiconductor substrate 11 is exposed on the bottom surface 104-1 of the trench 102-1.

In the 13th step, as shown in the fourth row from the top of FIG. 16, alkaline etching is performed on the semiconductor substrate 11 to form a projection part 107 extending in a rhombic shape at the bottom of the trench 102-1. At this time, the bottom of the trench 102-2 is not processed because of the mask 108-2.

Thereafter, by removing the silicon nitride film and embedding a desired material such as metal in the trenches 102-1 and 102-2, element separating parts 31-1 and 31-2 including protrusion parts 33-1 and 33-2 at different depths are formed, respectively.

Figure 17:
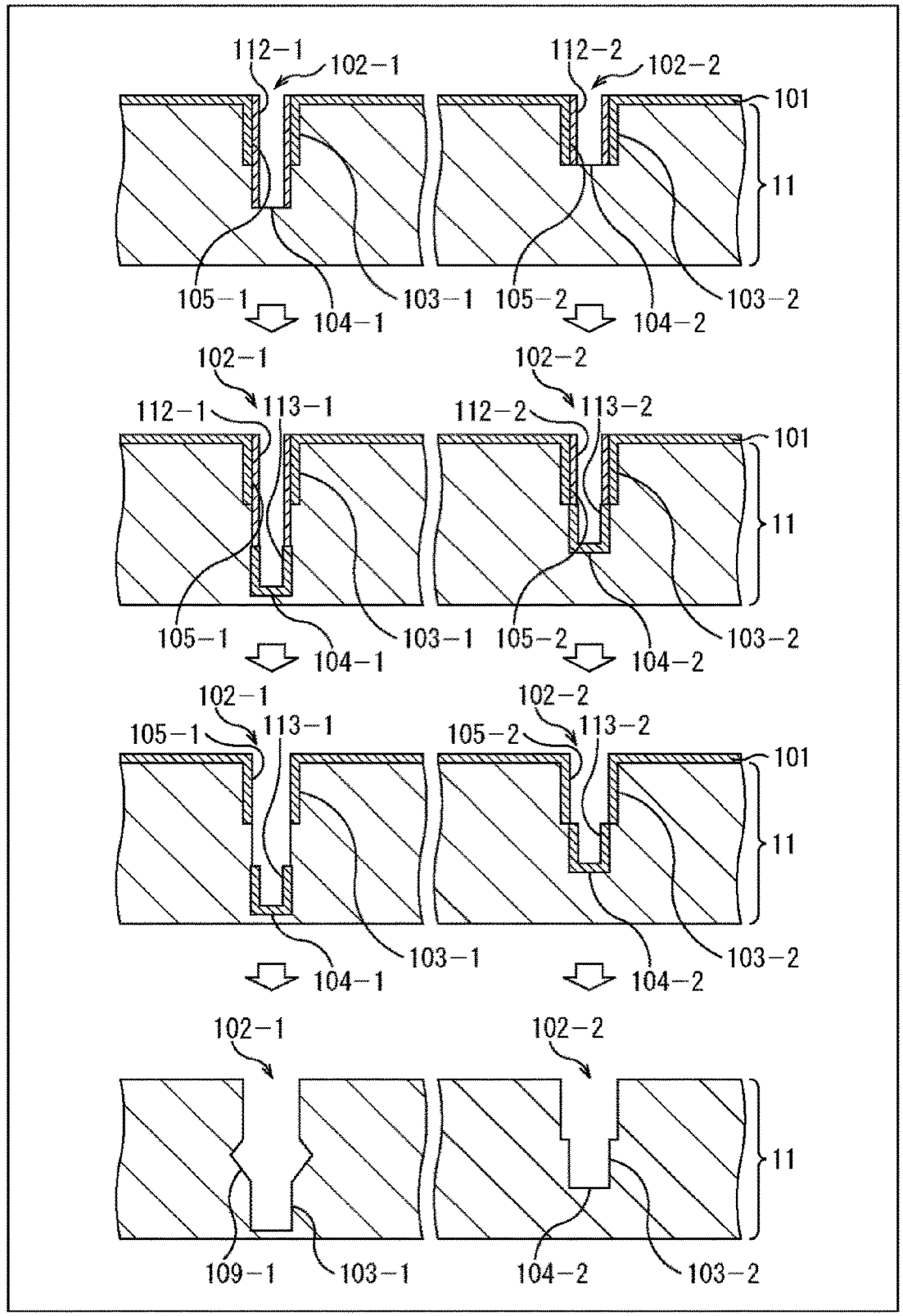
FIG. 17 is a diagram describing a third manufacturing method.

With reference to FIG. 17, a third manufacturing method will be described. For example, the third manufacturing method is a manufacturing method of separately making the element separating part 31E including the protrusion part 33E in the middle stage (see FIG. 9) and the element separating part 21 including the flat part 23.

In the 21st step, a silicon oxide (SiO2) film is formed on the back surface of the semiconductor substrate 11 to form the hard mask 101, and the semiconductor substrate 11 is etched, whereby the trenches 102-1 and 102-2 are processed. Subsequently, a silicon oxide film is formed inside the trenches 102-1 and 102-2, and the silicon oxide film on the bottom surface 104-1 of the trench 102-1 and the bottom surface 104-1-2 of the trench 102-2 is removed by etch back. With this operation, the sidewall 105-1 is formed on the side surface 103-1 of the trench 102-1, and the sidewall 105-2 is formed on the side surface 103-2 of the trench 102-2.

Then, a resist (not shown) is applied so as to be embedded in the trench 102-2, and the semiconductor substrate 11 is etched, whereby only the bottom surface 104-1 of the trench 102-1 is dug down. Moreover, the resist is removed from the trench 102-2, a silicon nitride film is formed inside the trenches 102-1 and 102-2, and the silicon nitride film on the bottom surface 104-1 of the trench 102-1 and the bottom surface 104-1-2 of the trench 102-2 is removed by etch back.

With this operation, as shown in the first row from the top of FIG. 17, a silicon nitride film 112-1 is formed on the side surface 103-1 of the trench 102-1, and a silicon nitride film 112-2 is formed on the side surface 103-2 of the trench 102-2.

In the 22nd step, by etching the semiconductor substrate 11, the bottom surface 104-1 of the trench 102-1 and the bottom surface 104-2 of the trench 102-2 are dug down, and a silicon oxide film is formed on the dug portion. With this operation, as shown in the second row from the top of FIG. 17, a hard mask 113-1 is formed in the region where the silicon nitride film 112-1 is not formed inside the trench 102-1, and a hard mask 113-2 is formed in the region where the silicon nitride film 112-2 is not formed inside the trench 102-2.

In the 23rd step, as shown in the third row from the top of FIG. 17, the silicon nitride film 112-1 and the silicon nitride film 112-2 are washed out. With this operation, the semiconductor substrate 11 is exposed in a part of the middle stage of the side surface 103-1 of the trench 102-1, while the side surface 103-2 of the trench 102-2 is covered with the side wall 105-2 and the hard mask 113-2.

In the 24th step, alkaline etching is performed on the semiconductor substrate 11, and the semiconductor substrate 11 exposed in the middle stage of the side surface 103-1 of the trench 102-1 undergoes silicon plane orientation selective etching to form a projection part 109-1. Then, by removing the silicon oxide film, as shown in the fourth row from the top of FIG. 17, the trench 102-1 including the projection part 109-1 in the middle stage and the trench 102-2 including the flatly formed bottom surface 104 can be made separately.

Thereafter, by embedding a desired material such as metal in the trenches 102-1 and 102-2, the element separating part 31E including the protrusion part 33E in the middle stage (see FIG. 9) and the element separating part 21 including the flat part 23 are formed.

Figure 18:
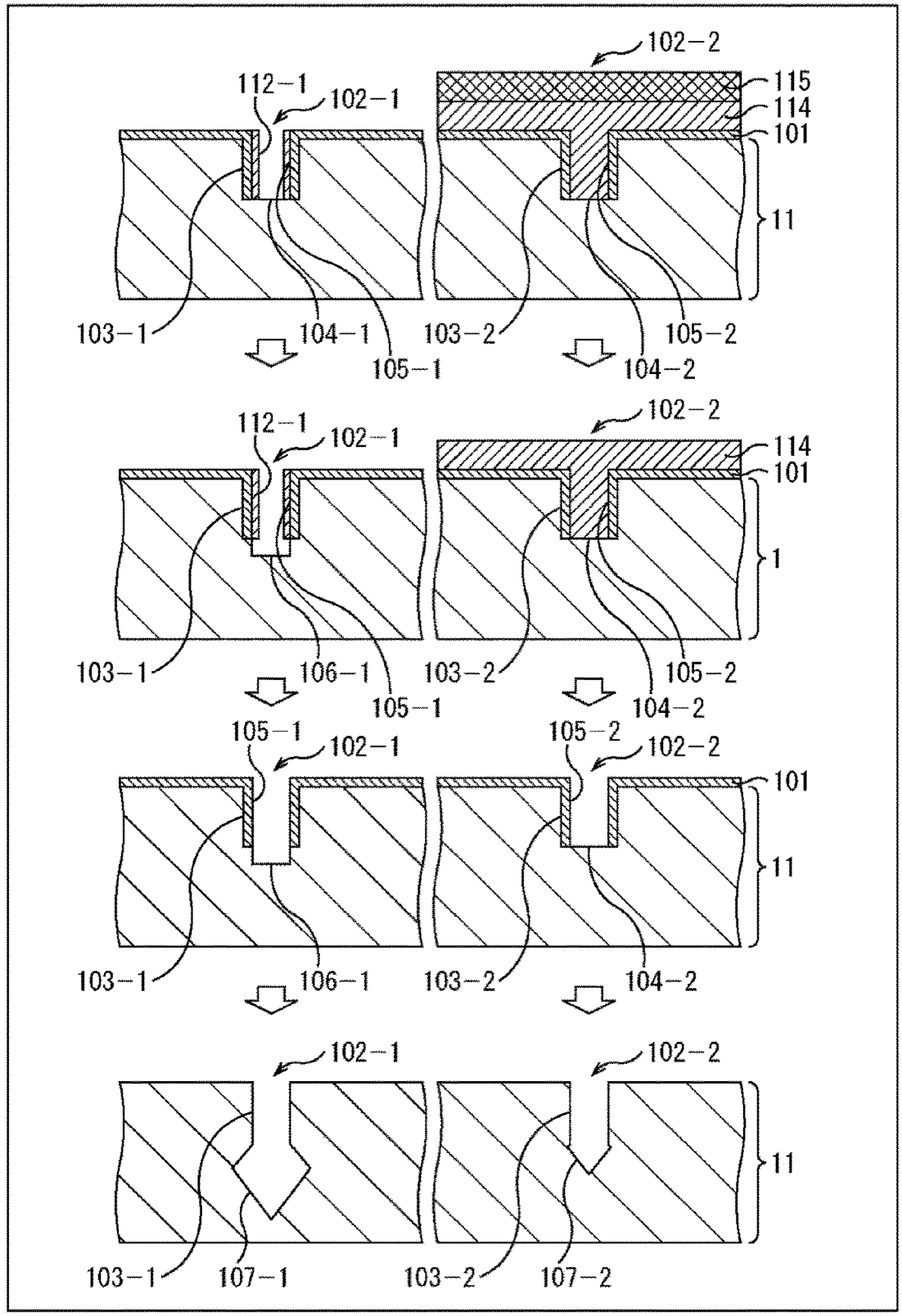
FIG. 18 is a diagram describing a fourth manufacturing method.

With reference to FIG. 18, a fourth manufacturing method will be described. For example, the fourth manufacturing method is a manufacturing method of separately making the element separating parts 31 including the protrusion parts 33 of different sizes.

In the 31st step, a silicon oxide film is formed on the back surface of the semiconductor substrate 11 to form the hard mask 101, and the semiconductor substrate 11 is etched, whereby the trenches 102-1 and 102-2 are processed. Subsequently, a silicon oxide film is formed inside the trenches 102-1 and 102-2, and the silicon oxide film on the bottom surface 104-1 of the trench 102-1 and the bottom surface 104-1-2 of the trench 102-2 is removed by etch back. With this operation, the sidewall 105-1 is formed on the side surface 103-1 of the trench 102-1, and the sidewall 105-2 is formed on the side surface 103-2 of the trench 102-2.

Then, a silicon nitride film is formed inside the trenches 102-1 and 102-2. At this time, in the trench 102-1, the silicon nitride film 112 is formed on the side surface 103-1, and in the trench 102-2, a silicon nitride film 114 is formed so as to be embedded inside thereof. Moreover, as shown in the first row from the top of FIG. 18, a resist 115 is applied to the trench 102-2 side.

In the 32nd step, after removing the resist 115, by etching the semiconductor substrate 11, as shown in the second row from the top of FIG. 18, the trench 102-1 is dug down to form a bottom surface 106-1.

In the 33rd step, the silicon nitride film 112 and the silicon nitride film 114 are removed. With this operation, as shown in the third row from the top of FIG. 18, in the trench 102-1, the semiconductor substrate 11 is exposed at the tip portion of the side surface 103-1 and the bottom surface 106-1, and in the trench 102-2, the semiconductor substrate 11 is exposed only on the bottom surface 104-2.

In the 34th step, alkaline etching is performed on the semiconductor substrate 11, and the semiconductor substrate 11 exposed at the tip portion of the side surface 103-1 and the bottom surface 106-1 inside the trench 102-1 undergoes silicon plane orientation selective etching to form a projection part 107-1. Meanwhile, the semiconductor substrate 11 exposed on the bottom surface 106-1 inside the trench 102-2 undergoes silicon plane orientation selective etching to form a projection part 107-2.

That is, as shown in the fourth row from the top of FIG. 18, it is possible to separately make the projection part 107-1 having a large shape in the tip portion of the trench 102-1 and the projection part 107-2 having a small shape in the tip portion of the trench 102-2.

Thereafter, by embedding a desired material such as metal in the trenches 102-1 and 102-2, the element separating parts 31 including the protrusion parts 33 each having a different size are formed.

Figure 19:
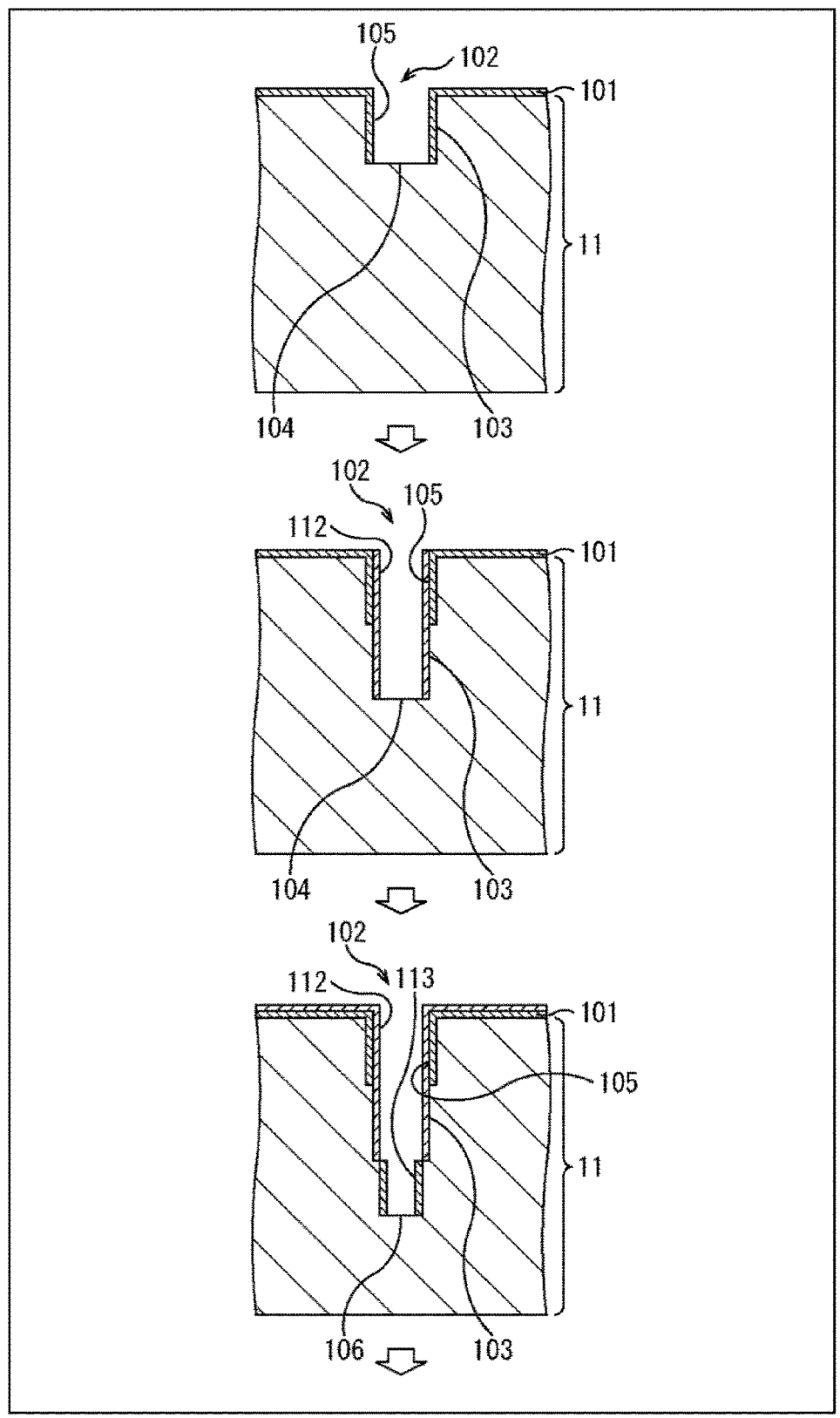
FIG. 19 is a diagram describing a fifth manufacturing method.
Figure 20:
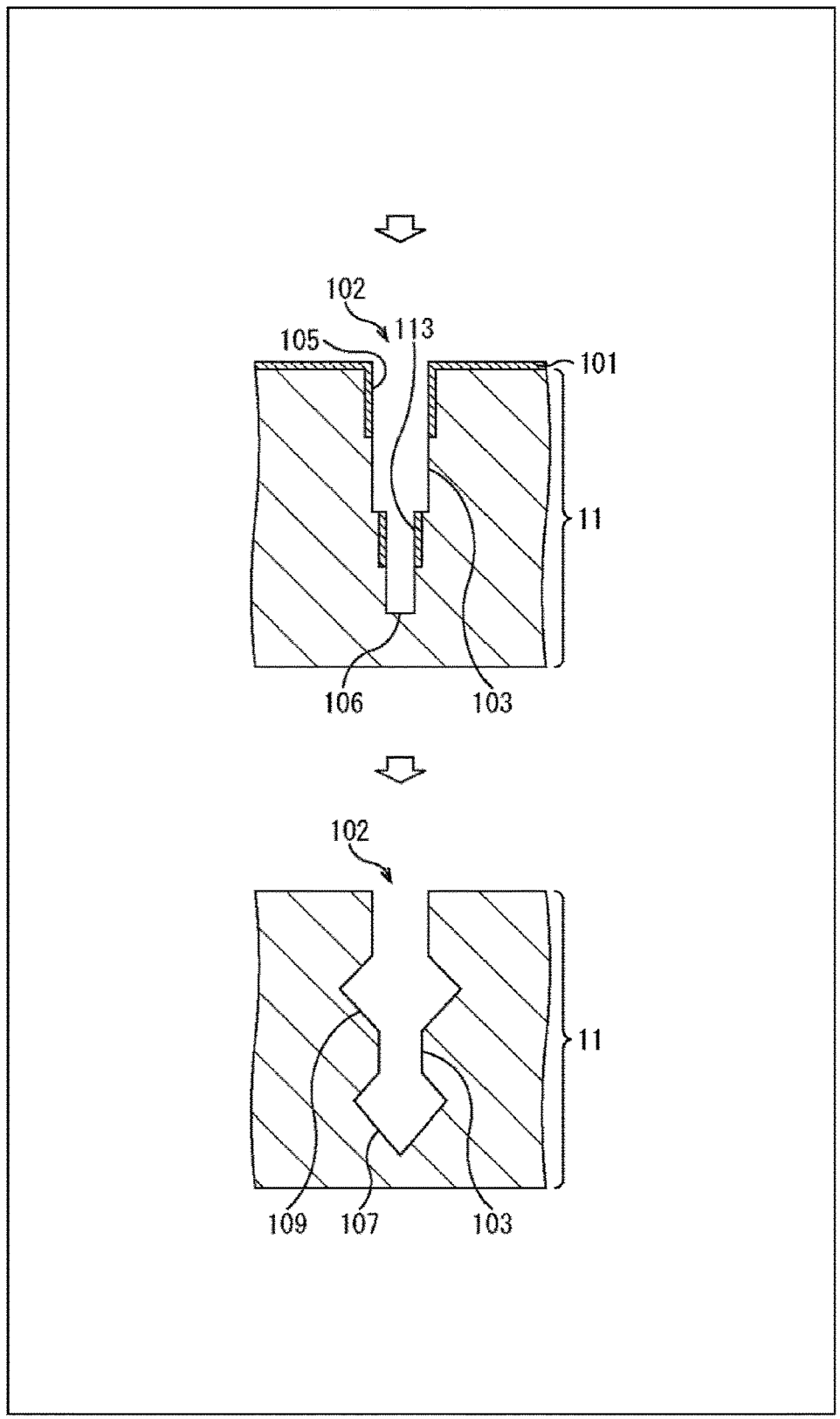
FIG. 20 is a diagram describing the fifth manufacturing method.

With reference to FIGS. 19 and 20, a fifth manufacturing method will be described. For example, the fifth manufacturing method is a manufacturing method of the element separating part 31 including a plurality of the protrusion parts 33.

In the 41st step, a silicon oxide film is formed on the back surface of the semiconductor substrate 11 to form the hard mask 101, and the semiconductor substrate 11 is etched, whereby the trench 102 is processed. Subsequently, a silicon oxide film is formed inside the trench 102, and the silicon oxide film on the bottom surface 104 of the trench 102 is removed by etch back, whereby the sidewall 105 is formed on the side surface 103 of the trench 102 as shown in the first row from the top of FIG. 19.

In the 42nd step, by etching the semiconductor substrate 11, the bottom surface 104 of the trench 102 is dug down and a silicon nitride film is formed inside the trench 102, and the silicon nitride film on the bottom surface 104 of the trench 102-1 is removed by etch back. With this operation, as shown in the second row from the top of FIG. 19, the silicon nitride film 112 is formed on the side surface 103 of the trench 102.

In the 43rd step, by etching the semiconductor substrate 11, the trench 102 is further dug down to form the bottom surface 106, a silicon oxide film is formed on the dug part, and the silicon oxide film on the bottom surface 106 is removed by etch back. With this operation, as shown in the third row from the top of FIG. 19, a hard mask 113 is formed in the region where the silicon nitride film 112 is not formed inside the trench 102.

In the 43rd step, by etching the semiconductor substrate 11, the bottom surface 106 of the trench 102 is further dug down and the silicon nitride film 112 is washed out. With this operation, as shown in the first row from the top of FIG. 20, the semiconductor substrate 11 is exposed at a part in the middle stage of the side surface 103 of the trench 102 and at the tip portion of the side surface 103 and on the bottom surface 106 of the trench 102.

In the 45th step, alkaline etching is performed on the semiconductor substrate 11, and the semiconductor substrate 11 exposed in the middle stage and at the tip inside the trench 102 undergoes silicon plane orientation selective etching. With this operation, the projection part 109 is formed in the middle stage of the trench 102, and the projection part 107 is formed at the tip of the trench 102.

Thereafter, by embedding a desired material such as metal in the trench 102, the element separating part 31 including two protrusion parts 33 is formed. Of course, by repeating similar steps, the element separating part 31 including three or more protrusion parts 33 can be formed.

Figure 21:
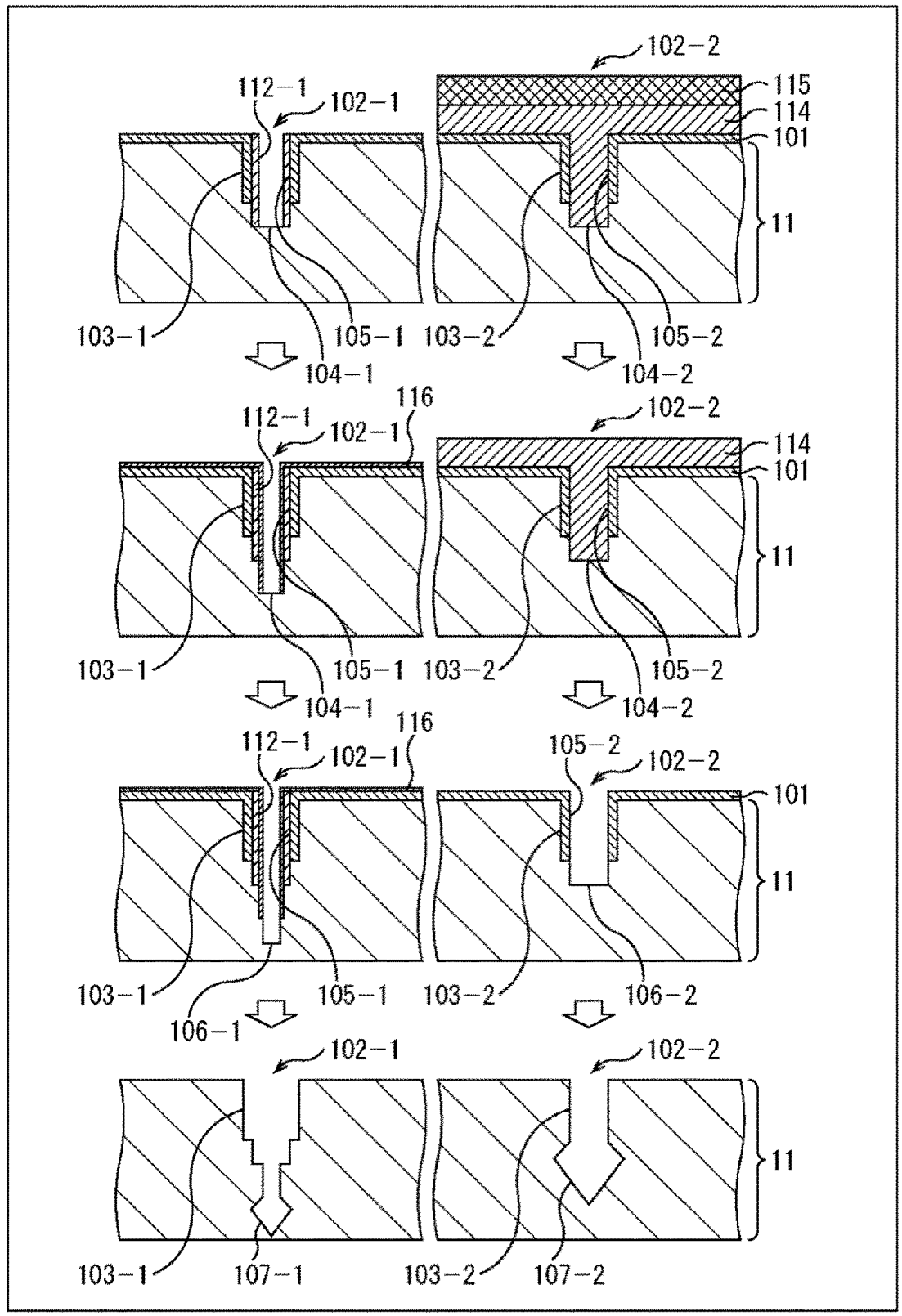
FIG. 21 is a diagram describing a sixth manufacturing method.

With reference to FIG. 21, a sixth manufacturing method will be described. For example, the sixth manufacturing method is a manufacturing method of separately making the element separating parts 31 including the protrusion parts 33 at different depths.

In the 51st step, a silicon oxide film is formed on the back surface of the semiconductor substrate 11 to form the hard mask 101, and the semiconductor substrate 11 is etched, whereby the trenches 102-1 and 102-2 are processed. Subsequently, a silicon oxide film is formed inside the trenches 102-1 and 102-2, and the silicon oxide film on the bottom surface 104-1 of the trench 102-1 and the bottom surface 104-1-2 of the trench 102-2 is removed by etch back. With this operation, the sidewall 105-1 is formed on the side surface 103-1 of the trench 102-1, and the sidewall 105-2 is formed on the side surface 103-2 of the trench 102-2.

Then, by etching the semiconductor substrate 11, the bottom surface 104-1 of the trench 102-1 is dug down, and the bottom surface 104-2 of the trench 102-2 is dug down, and a silicon nitride film is formed inside the trenches 102-1 and 102-2. At this time, in the trench 102-1, the silicon nitride film 112 is formed on the side surface 103-1, and in the trench 102-2, a silicon nitride film 114 is formed so as to be embedded inside thereof. Moreover, as shown in the first row from the top of FIG. 21, the resist 115 is applied to the trench 102-2 side.

In the 52nd step, after removing the resist 115, by etching the semiconductor substrate 11, the bottom surface 104-1 of the trench 102-1 is further dug down. Then, a silicon oxide film is formed inside the trench 102-1 by chemical vapor deposition (CVD), and the silicon oxide film on the bottom surface 104-1 of the trench 102-1 is removed by etch back. With this operation, as shown in the second row from the top of FIG. 21, the silicon oxide film 116 is formed.

In the 53rd step, by etching the semiconductor substrate 11, after digging down the trench 102-1 to form the bottom surface 106-1, the silicon nitride film 114 is washed out. With this operation, as shown in the third row from the top of FIG. 21, the trench 102-1 with the deeply formed bottom surface 106-1 and the trench 102-2 with the shallowly formed bottom surface 104-2 are formed.

In the 54th step, alkaline etching is performed on the semiconductor substrate 11, and the semiconductor substrate 11 exposed at the tip portion of the side surface 103-1 and the bottom surface 106-1 inside the trench 102-1 undergoes silicon plane orientation selective etching to form the projection part 107-1. Similarly, the semiconductor substrate 11 exposed at the tip portion of the side surface 103-2 and the bottom surface 106-2 inside the trench 102-2 undergoes silicon plane orientation selective etching to form the projection part 107-2.

That is, as shown in the fourth row from the top of FIG. 21, it is possible to separately make the trench 102-1 in which the projection part 107-1 is formed in a deep region and the trench 102-2 in which the projection part 107-2 is formed in a shallow region.

Thereafter, by removing the silicon nitride film and the silicon oxide film and embedding a desired material such as metal in the trenches 102-1 and 102-2, the element separating parts 31-1 and 31-2 including the protrusion parts 33-1 and 33-2 at different depths are formed, respectively.

Note that the steps of forming silicon nitride and silicon oxide may be reversed. If etching selectivity at the time of washout can be ensured, it is possible to select a combination of other film types.

Figure 22:
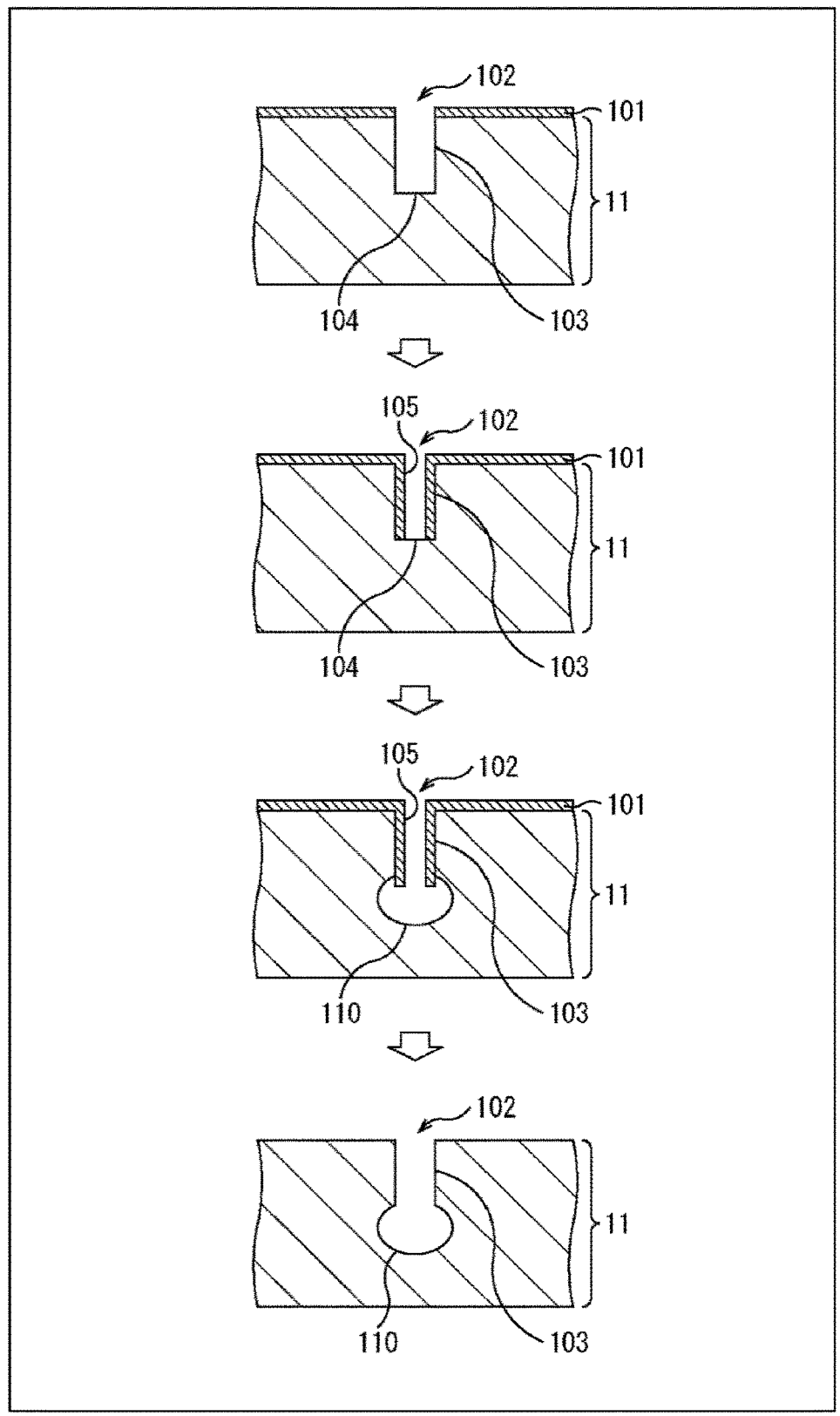
FIG. 22 is a diagram describing a seventh manufacturing method.

With reference to FIG. 22, a seventh manufacturing method will be described. For example, the seventh manufacturing method is a manufacturing method of the element separating part 31 including the protrusion part 33 formed by isotropic etching using an acidic etching chemical solution.

In the 61st step, as shown in the first row from the top of FIG. 22, a silicon oxide film is formed on the back surface of the semiconductor substrate 11 to form the hard mask 101, and the semiconductor substrate 11 is etched, whereby the trench 102 is processed.

In the 62nd step, as shown in the second row from the top of FIG. 22, the sidewall film 105 is formed on the side surface 103 of the trench 102. For example, by forming the silicon nitride film on the entire inner surface of the trench 102 and then etching back the bottom surface portion of the trench 102 to remove the silicon nitride film, the sidewall 105 is formed.

In the 63rd step, as shown in the third row from the top of FIG. 22, isotropic etching is performed on the semiconductor substrate 11 by using an acidic chemical solution to form the bottom surface 110 extending in a substantially spherical shape at the bottom of the trench 102.

In the 64th step, as shown in the fourth row from the top of FIG. 22, the silicon nitride film is removed.

Thereafter, by embedding a desired material such as metal in the trench 102, the element separating part 31 including the protrusion part 33 formed by isotropic etching is formed.

Figure 23:
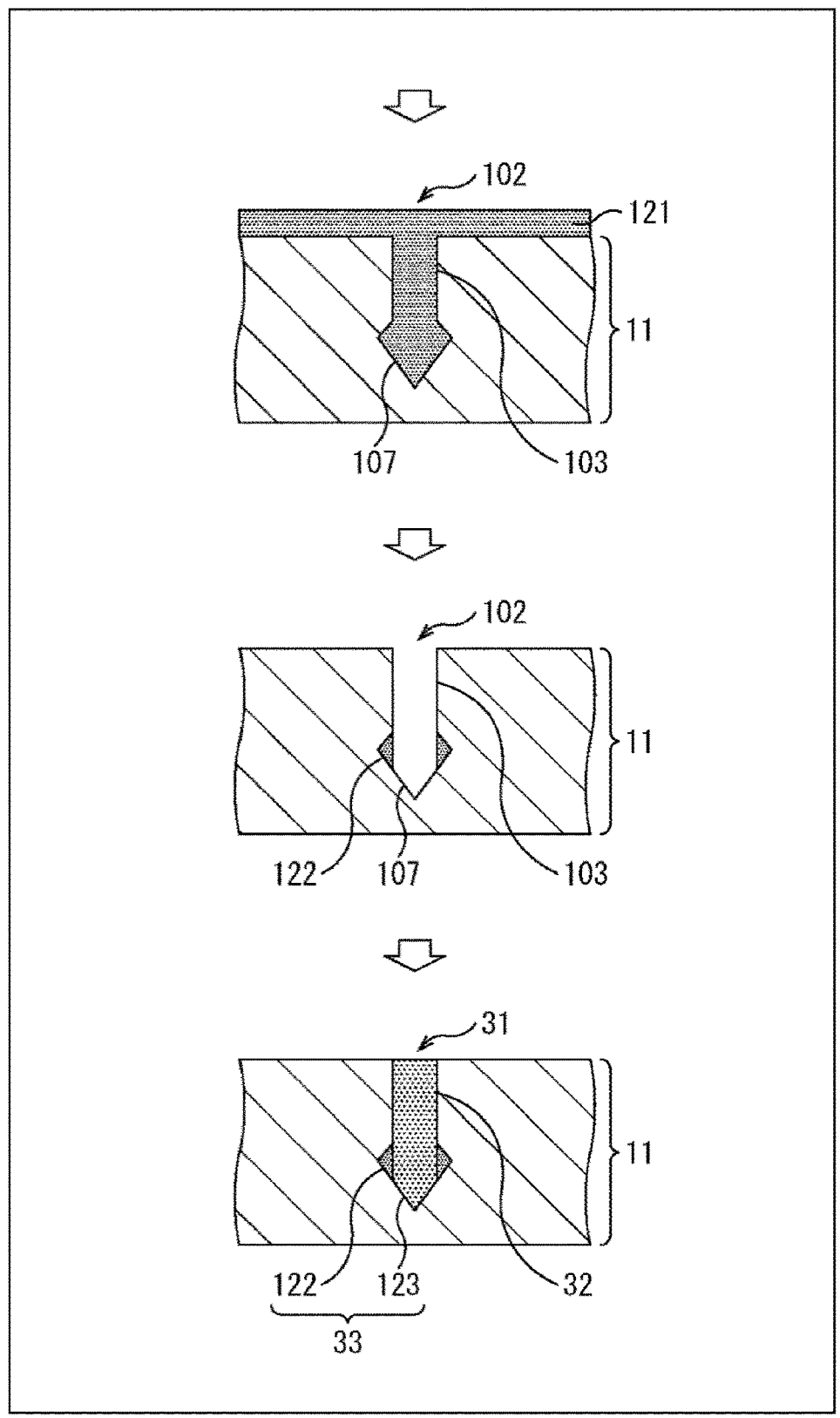
FIG. 23 is a diagram describing an eighth manufacturing method.

With reference to FIG. 23, an eighth manufacturing method will be described. For example, the eighth manufacturing method is a manufacturing method of the element separating part 31 including the protrusion part 33 with a different type of material embedded.

To begin with, by performing the first to fourth steps described with reference to FIG. 15, the projection part 107 of the trench 102 is formed in a rhombus shape extending beyond the side surface 103.

Thereafter, in the 71st step, as shown in the first row from the top of FIG. 23, tungsten 121 is embedded in the trench 102.

In the 72nd step, by performing etch back, the tungsten 121 other than the projection part inside the trench 102 is removed such that the tungsten 122 remains in the projection part projecting in the side surface direction from the side surface 103 inside the trench 102. That is, that is, as shown in the second row from the top of FIG. 23, it is assumed that the tungsten 122 is embedded only in the projection part of the trench 102.

In the 73rd step, as shown in the third row from the top of FIG. 23, aluminum 123 is embedded inside the trench 102, and the semiconductor substrate 11 is flattened by chemical mechanical polishing (CMP) and dry etching. With this operation, the element separating part 31 is formed in which the tungsten 122 is embedded in the projection part of the protrusion part 33 and the aluminum 123 is embedded in other than the projection part of the protrusion part 33.

Here, the tungsten 122 embedded in the projection part of the protrusion part 33 is a material that absorbs light relatively more easily than the aluminum 123 embedded inside the trench 102 other than the projection part (hereinafter referred to as a high-absorption material). That is, in the projection part of the protrusion part 33, the high-absorption material having an absorption coefficient higher than the absorption coefficient of the material embedded inside the trench 102 other than the projection part is embedded. Furthermore, the aluminum 123 embedded inside the trench 102 other than the projection part of the protrusion part 33 is a material that reflects light more easily than the tungsten 122 embedded in the projection part of the protrusion part 33 (hereinafter referred to as a high-reflection material). That is, inside the trench 102 other than the projection part of the protrusion part 33, the high-reflection material with a higher reflectance than the reflectance of the material embedded in the projection part of the protrusion part 33 is embedded.

For example, it is known that reflected light generated in a deep place of the element separating part 31 easily causes color mixing with the adjacent pixel 52. Therefore, by embedding the tungsten 122, which is a high-absorption material, in the projection part of the protrusion part 33, and by embedding the aluminum 123, which is a high-reflection material, in the protrusion part 33 other than the projection part, color mixing with the adjacent pixel 52 can be inhibited. That is, by embedding the tungsten 122 having a lower reflectance to light and a higher absorption coefficient than the aluminum 123 embedded inside the trench 102 other than the projection part of the protrusion part 33 in the projection part of the protrusion part 33, it is possible to inhibit color mixing with the adjacent pixel 52.

Note that the material embedded in the projection part of the protrusion part 33 is required at least to have a relatively lower reflectance than the material embedded inside the trench 102 other than the projection part of the protrusion part 33, and is not limited to a combination of the tungsten 122 and the aluminum 123 as described above. Specifically, as the high-reflection material, silver, gold, copper, cobalt, or the like may be used in addition to aluminum. As the high-absorption material, tantalum (tantalum nitride), titanium (titanium nitride), chromium, molybdenum, nickel, platinum, or the like may be used in addition to tungsten.

<Configuration Example of Electronic Device>

The image capturing element 51 as described above can be applied to various electronic devices, for example, an image capturing system such as a digital still camera or a digital video camera, a mobile phone having an image capturing function, or another device having an image capturing function.

Figure 24:
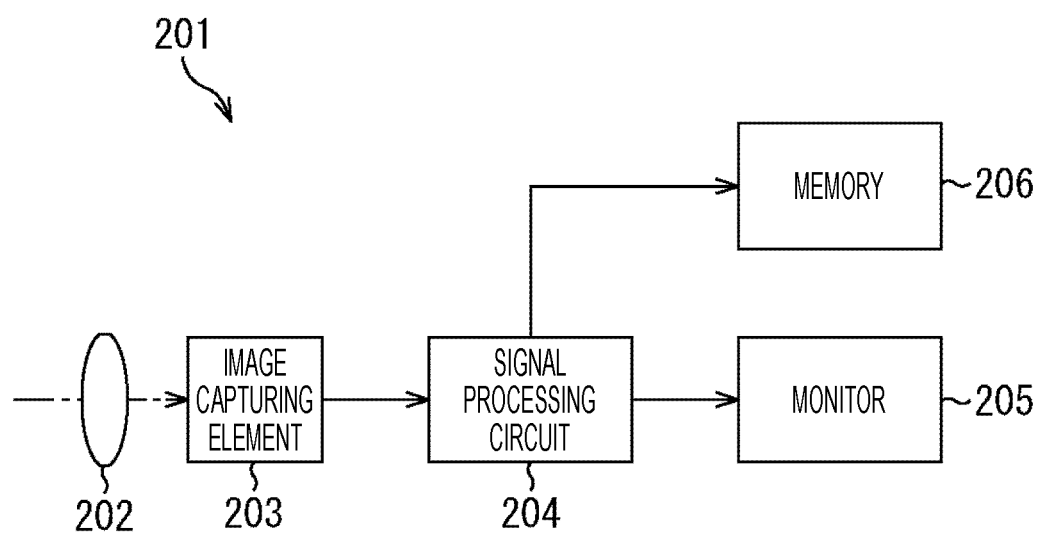
FIG. 24 is a block diagram showing a configuration example of an image capturing device.

FIG. 24 is a block diagram showing a configuration example of an image capturing device mounted on an electronic device.

As shown in FIG. 24, the image capturing device 201 includes an optical system 202, an image capturing element 203, a signal processing circuit 204, a monitor 205, and a memory 206, and can capture still images and moving images.

The optical system 202 includes one or more lenses, guides image light (incident light) from a subject to the image capturing element 203, and forms an image on a light receiving surface of the image capturing element 203 (sensor unit).

As the image capturing element 203, the above-described image capturing element 51 is applied. Electrons are stored in the image capturing element 203 for a certain period of time according to the image formed on the light receiving surface via the optical system 202. Then, a signal according to the electrons stored in the image capturing element 203 is supplied to the signal processing circuit 204.

The signal processing circuit 204 performs various types of signal processing on the pixel signal output from the image capturing element 203. An image obtained by the signal processing circuit 204 performing signal processing (image data) is supplied to the monitor 205 for display or supplied to the memory 206 for storage (recording).

The image capturing device 201 configured in this way can, for example, capture a higher quality image with inhibited crosstalk by applying the image capturing element 51 described above.

<Usage Example of Image Sensor>

Figure 25:
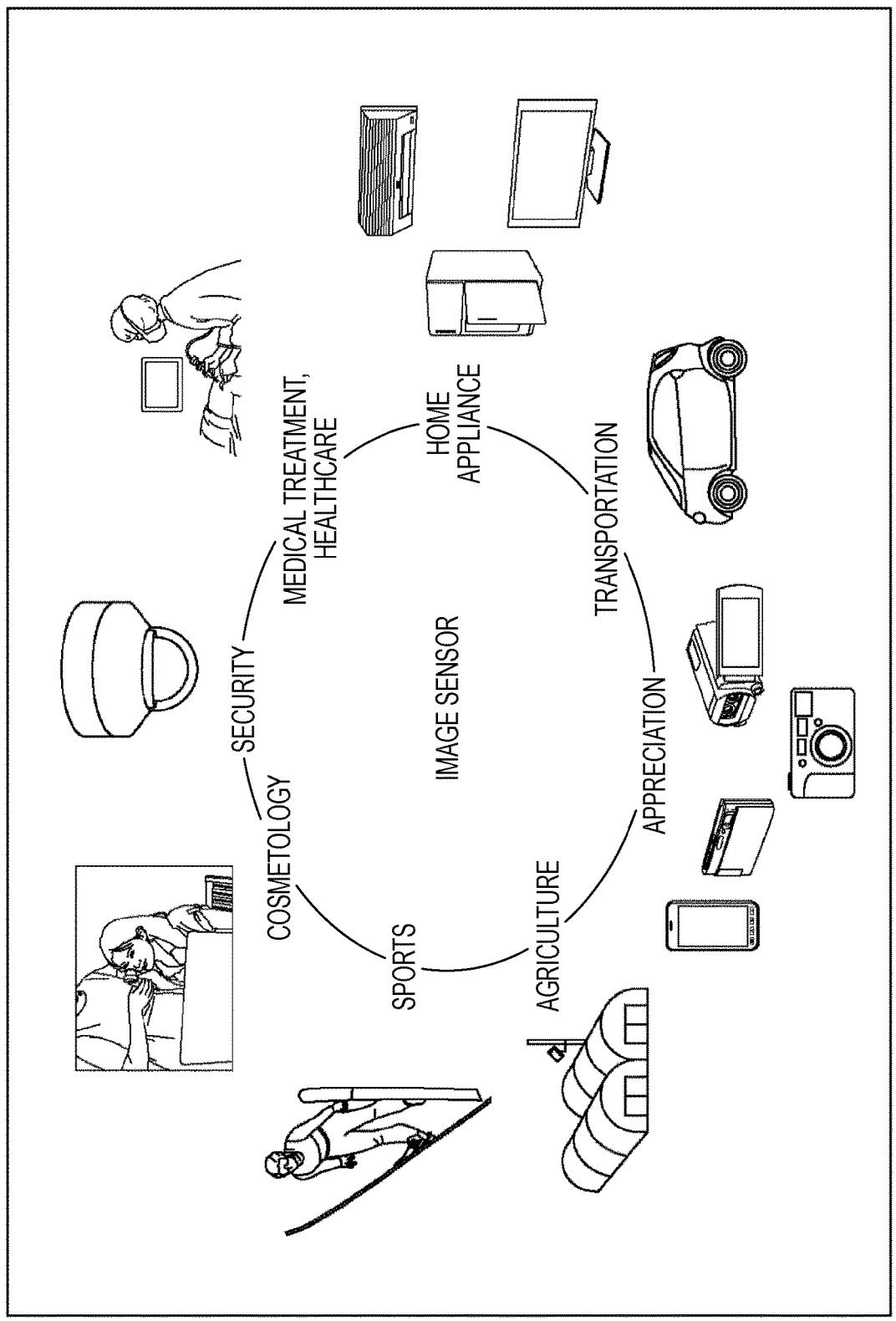
FIG. 25 is a diagram showing a usage example using an image sensor.
Figure 26:
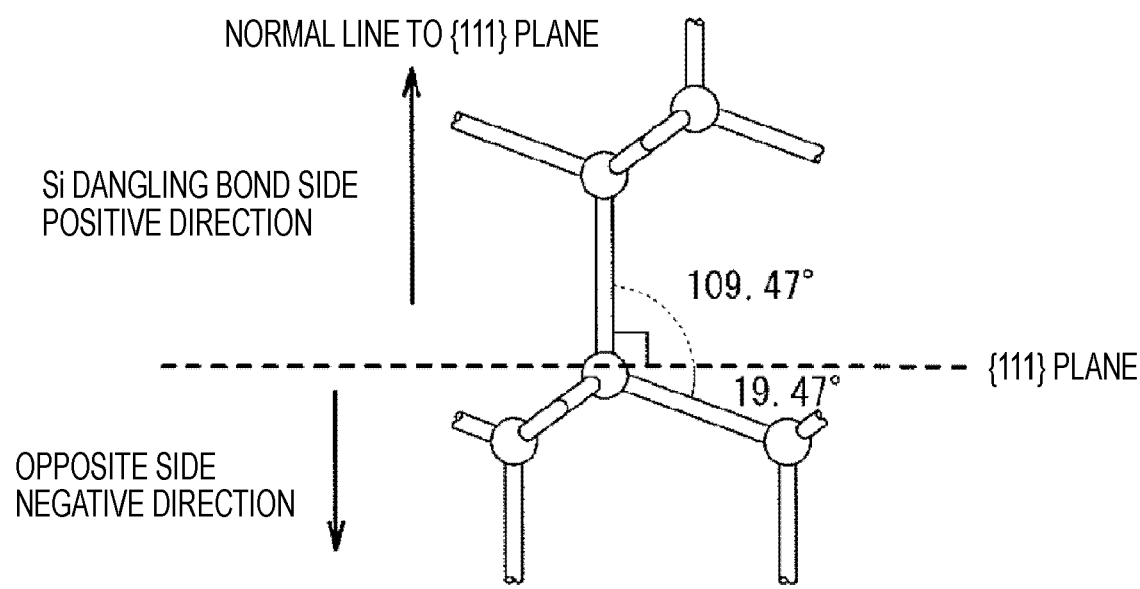
FIG. 26 is a schematic diagram describing back bonds on a crystal plane of an Si substrate of the present disclosure.

FIG. 25 is a diagram showing a usage example using the image sensor described above (image capturing element).

The image sensor described above can be used in various cases for sensing light, for example, as described below, visible light, infrared light, ultraviolet light, X-ray, and the like.

- Device that captures images to be used for appreciation, such as a digital camera and a mobile device with a camera function.
- Device to be used for transportation, such as a vehicle-mounted sensor that captures the front, rear, surroundings, interior, and the like of an automobile, a surveillance camera that monitors traveling vehicles and roads, a distance measuring sensor that measures distance between vehicles and the like for safe driving such as automatic stop and recognition of the driver's condition, and the like.
- Device to be used in home appliances, such as TV, refrigerator, and air conditioner to capture user gesture and operate the device according to the gesture.
- Device to be used for medical treatment and healthcare, such as an endoscope and a device that performs angiography by receiving infrared light.
- Device to be used for security, such as a surveillance camera for crime prevention and a camera for person authentication.
- Device to be used for cosmetology, such as a skin measuring device that captures images of skin and a microscope that captures images of scalp.
- Device to be used for sports, such as an action camera and wearable camera for sports applications or the like.
- Device to be used for agriculture, such as a camera for monitoring conditions of fields and crops.

The Si {111} substrate in the present disclosure is a substrate or wafer including a silicon single crystal and having a crystal plane represented as {111} in the Miller index notation. The Si {111} substrate in the present disclosure also includes a substrate or wafer whose crystal orientation is deviated by several degrees, for example, deviated by several degrees from the {111} plane in the closest [110] direction. Moreover, a substrate or wafer obtained by growing a silicon single crystal on a part or the entire surface of the substrate or wafer by the epitaxial method or the like is also included.

Furthermore, in notation of the present disclosure, the {111} plane is a general term for the (111) plane, (−111)

plane, (1-11) plane, (11-1) plane, (-1-11) plane, (-11-1) plane, (1-1-1) plane, and (-1-1-1) plane, which are crystal planes equivalent to each other in terms of symmetry. Therefore, description of the Si {111} substrate in the specification and the like of the present disclosure may be read as, for example, the Si (1-11) substrate. Here, the bar sign for expressing the negative index of the Miller index is replaced with a minus sign.

Furthermore, the <110> direction in the present embodiment is a general term for the [110] direction, [101] direction, [011] direction, [-110] direction, [1-10] direction, [-101] direction, [10-1] direction, [0-11] direction, [01-1] direction, [-1-10] direction, [-10-1] direction, and [0-1-1] direction, which are crystal plane directions equivalent to each other in terms of symmetry, and may be read as either one. However, the present disclosure performs etching in a direction orthogonal to the element forming plane and a direction further orthogonal to the direction orthogonal to the element forming plane (that is, direction parallel to the element forming plane).

Table 1 shows specific combinations of planes and orientations in which etching in the <110> direction is established on the {111} plane, which is a crystal plane of the Si {111} substrate in the present embodiment.

TABLE 1

| Etching orientation | Element Forming Surface | | | | | | | |
|---|---|---|---|---|---|---|---|---|
| | (111) | (-111) | (1-11) | (11-1) | (-1-11) | (-11-1) | (1-1-1) | (-1-1-1) |
| [110] | | ○ | ○ | | | ○ | ○ | |
| [101] | | ○ | | ○ | ○ | | ○ | |
| [011] | | | ○ | ○ | ○ | ○ | | |
| [-110] | ○ | | | ○ | ○ | | | ○ |
| [1-10] | ○ | | | ○ | ○ | | | ○ |
| [-101] | ○ | | ○ | | | ○ | | ○ |
| [10-1] | ○ | | ○ | | | ○ | | ○ |
| [0-11] | ○ | ○ | | | | | ○ | ○ |
| [01-1] | ○ | ○ | | | | | ○ | ○ |
| [-1-10] | | ○ | ○ | | | ○ | ○ | |
| [-10-1] | | ○ | | ○ | ○ | | ○ | |
| [0-1-1] | | | ○ | ○ | ○ | ○ | | |

As shown in Table 1, there are 96 (=8×12) combinations of the {111} plane and the <110> direction. However, the <110> direction of the present disclosure is limited to the direction orthogonal to the {111} plane, which is the element forming plane, and the direction parallel to the element forming plane. That is, the combination of the element forming plane on the Si {111} substrate of the present disclosure and the orientation in which etching is performed on the Si {111} substrate is selected from either of the combinations indicated with circles in Table 1.

Figure 27:
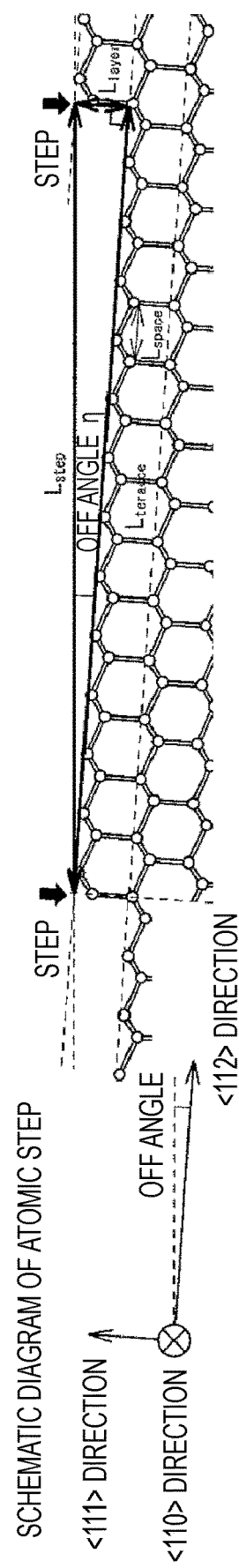
FIG. 27 is a schematic diagram describing an off angle on a surface of the Si substrate of the present disclosure.

Furthermore, the above-described embodiment has illustrated a case where etching in the X-axis direction progresses but etching does not progress in the Y-axis direction and the Z-axis direction by using the Si {111} substrate. However, the present disclosure is not limited to this case, and it is only required that there is an etching progress orientation in both the X-axis direction and the Y-axis direction, or in either the X-axis direction or the Y-axis direction. Furthermore, the Si {111} substrate includes, for example, a substrate in which a surface of the substrate is processed so as to have an off angle with respect to the <112> direction, as shown in FIG. 27. In a case where the off angle is 19.47° or less, even in a case where a substrate having an off angle is used, the relationship of the etching rate being sufficiently higher in the <110> direction, that is, in the direction of having one Si back bond than the etching rate in the <111> direction, that is, in the direction having three Si back bonds is maintained. As the off angle increases, the number of steps increases and density of micro steps increases, and therefore 5° or less is preferable. Note that the example of FIG. 27 mentions a case where the substrate surface has an off angle in the <112> direction, but it does not matter in a case where there is an off angle in the <110> direction, and the off-angle direction does not matter. Furthermore, the Si plane orientation can be analyzed by using the X-ray diffraction method, the electron beam diffraction method, the electron beam backscattering diffraction method, or the like. Since the number of Si back bonds is determined with the crystal structure of Si, the number of back bonds can also be analyzed by analyzing the Si plane orientation.

<Combination Example of Configuration>

Note that the present technology can also have the following configurations.

(1)

An image capturing element including:

a semiconductor substrate in which photoelectric conversion parts that photoelectrically convert emitted light are formed;

a trench part provided from a light-receiving surface side of the semiconductor substrate and between a plurality of the photoelectric conversion parts; and a protrusion part provided with at least an inclined surface that is inclined with respect to a side surface of the trench part to widen a space of the trench part in one part of the trench part.

(2)

The image capturing element according to (1) described above, in which the protrusion part includes the inclined surface along a predetermined plane orientation of a crystal constituting the semiconductor substrate.

(3)

The image capturing element according to (1) or (2) described above, in which the protrusion part is provided at a tip of the trench part.

(4)

The image capturing element according to any one of (1) to (3) described above, in which the protrusion part is provided in a middle stage from the light receiving surface of the semiconductor substrate to a tip of the trench part.

(5)
The image capturing element according to any one of (1) to (4) described above, in which
the protrusion part is provided at a plurality of places from the light receiving surface of the semiconductor substrate to a tip of the trench part.

(6)
The image capturing element according to any one of (1) to (5) described above, in which
a material that inhibits transmission of light is embedded in the trench part and the protrusion part.

(7)
The image capturing element according to (6) described above, in which
a first material embedded in a projection part of the protrusion part projecting laterally from a side surface of the trench part, and a second material embedded inside the trench part other than the projection part have different characteristics.

(8)
The image capturing element according to (7) described above, in which
the first material has a higher absorption coefficient to light than the second material, and the second material has a higher reflectance to light than the first material.

(9)
The image capturing element according to any one of (1) to (8) described above, in which
the semiconductor substrate is an Si {111} substrate with a thickness direction defined as a first direction and having a first crystal plane represented with a plane index {111} extending along a horizontal plane orthogonal to the first direction, and
the inclined surface of the protrusion part includes a surface along a crystal plane of the Si {111} substrate that is inclined with respect to the first direction and is represented with the plane index {111}.

(10)
An image capturing element including:
an Si substrate having a thickness direction defined as a first direction and extending along a horizontal plane orthogonal to the first direction;
photoelectric conversion parts provided in the Si substrate and generating a charge according to an amount of received light by photoelectric conversion; and
a protrusion part including at least an inclined surface that is inclined with respect to a side surface of a trench part to widen a space of the trench part in one part of the trench part provided between a plurality of the photoelectric conversion parts,
in which the protrusion part includes a plane along a second crystal plane that is inclined with respect to the first direction and has three Si back bonds.

(11)
A manufacturing method including, by a manufacturing device that manufactures an image capturing element:
digging a trench part provided from a light-receiving surface side of a semiconductor substrate in which photoelectric conversion parts that photoelectrically convert emitted light are formed and between a plurality of the photoelectric conversion parts; and
forming a protrusion part including at least an inclined surface inclined with respect to a side surface of the trench part to widen a space of the trench part in one part of the trench part.

(12)
An electronic device including an image capturing element including:
a semiconductor substrate in which photoelectric conversion parts that photoelectrically convert emitted light are formed;
a trench part provided from a light-receiving surface side of the semiconductor substrate and between a plurality of the photoelectric conversion parts; and
a protrusion part including at least an inclined surface that is inclined with respect to a side surface of the trench part to widen a space of the trench part in one part of the trench part.

(13)
The manufacturing method according to (11) described above, further including
forming the protrusion part by silicon plane orientation selective etching using an alkaline chemical solution.

Note that the present embodiment is not limited to the embodiment described above, and various modifications may be made without departing from the spirit of the present disclosure. Furthermore, effects described in the present specification are merely illustrative and not restrictive, and other effects may be produced.

REFERENCE SIGNS LIST

11 Semiconductor substrate
12 Flattening film
13 Filter layer
14 On-chip lens layer
15 Wiring layer
21 Element separating part
22 Trench side surface
23 Flat part
24 and 25 Light-shielding part
31 Element separating part
32 Trench side surface
33 Protrusion part
34 and 35 Light-shielding part
51 Image capturing element
52 Pixel
53 Color filter
54 Micro lens
55 Inner lens
61 Light-shielding wall
62 Charge storage unit
63 Opening
64 FD part

The invention claimed is:
1. An image capturing element comprising:
a semiconductor substrate in which photoelectric conversion parts that photoelectrically convert emitted light are formed;
a trench part provided from a light-receiving surface side of the semiconductor substrate and between a plurality of the photoelectric conversion parts; and
a protrusion part provided with at least an inclined surface that is inclined with respect to a side surface of the trench part to widen a space of the trench part in one part of the trench part, wherein
a material that inhibits transmission of light is embedded in the trench part and the protrusion part,
a first material embedded in a projection part of the protrusion part projecting laterally from a side surface of the trench part, and a second material embedded inside the trench part other than the projection part have different characteristics, the first material has a higher absorption coefficient to light than the second material, and the second material has a higher reflectance to light than the first material.

2. The image capturing element according to claim 1, wherein
the protrusion part includes the inclined surface along a predetermined plane orientation of a crystal constituting the semiconductor substrate.

3. The image capturing element according to claim 1, wherein
the protrusion part is provided at a tip of the trench part.

4. The image capturing element according to claim 1, wherein
the protrusion part is provided in a middle stage from the light receiving surface of the semiconductor substrate to a tip of the trench part.

5. The image capturing element according to claim 1, wherein
the protrusion part is provided at a plurality of places from the light receiving surface of the semiconductor substrate to a tip of the trench part.

6. The image capturing element according to claim 1, wherein
the semiconductor substrate is an Si {111} substrate with a thickness direction defined as a first direction and having a first crystal plane represented with a plane index {111} extending along a horizontal plane orthogonal to the first direction, and
the inclined surface of the protrusion part includes a surface along a crystal plane of the Si {111} substrate that is inclined with respect to the first direction and is represented with the plane index {111}.

7. An image capturing element comprising:
an Si substrate having a thickness direction defined as a first direction and extending along a horizontal plane orthogonal to the first direction;
photoelectric conversion parts provided in the Si substrate and generating a charge according to an amount of received light by photoelectric conversion; and
a protrusion part including at least an inclined surface that is inclined with respect to a side surface of a trench part to widen a space of the trench part in one part of the trench part provided between a plurality of the photoelectric conversion parts,
wherein the protrusion part includes a plane along a second crystal plane that is inclined with respect to the first direction and has three Si back bonds.

8. A manufacturing method comprising, by a manufacturing device that manufactures an image capturing element:
digging a trench part provided from a light-receiving surface side of a semiconductor substrate in which photoelectric conversion parts that photoelectrically convert emitted light are formed and between a plurality of the photoelectric conversion parts; and
forming a protrusion part including at least an inclined surface inclined with respect to a side surface of the trench part to widen a space of the trench part in one part of the trench part, and
embedding, in the trench part and the protrusion part, a material that inhibits transmission of light, wherein
a first material is embedded in a projection part of the protrusion part projecting laterally from a side surface of the trench part, and a second material is embedded inside the trench part other than the projection part have different characteristics,
the first material has a higher absorption coefficient to light than the second material, and
the second material has a higher reflectance to light than the first material.

9. An electronic device comprising an image capturing element including:
a semiconductor substrate in which photoelectric conversion parts that photoelectrically convert emitted light are formed;
a trench part provided from a light-receiving surface side of the semiconductor substrate and between a plurality of the photoelectric conversion parts; and
a protrusion part including at least an inclined surface that is inclined with respect to a side surface of the trench part to widen a space of the trench part in one part of the trench part, wherein
a material that inhibits transmission of light is embedded in the trench part and the protrusion part,
a first material embedded in a projection part of the protrusion part projecting laterally from a side surface of the trench part, and a second material embedded inside the trench part other than the projection part have different characteristics,
the first material has a higher absorption coefficient to light than the second material, and
the second material has a higher reflectance to light than the first material.

* * * * *